(12) United States Patent
Hollmer et al.

(10) Patent No.: US 8,854,873 B1
(45) Date of Patent: Oct. 7, 2014

(54) MEMORY DEVICES, ARCHITECTURES AND METHODS FOR MEMORY ELEMENTS HAVING DYNAMIC CHANGE IN PROPERTY

(75) Inventors: Shane Charles Hollmer, Grass Valley, CA (US); John Dinh, Dublin, CA (US); Derric Jawaher Herman Lewis, Sunnyvale, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 63 days.

(21) Appl. No.: 13/464,926

(22) Filed: May 4, 2012

Related U.S. Application Data

(60) Provisional application No. 61/482,742, filed on May 5, 2011.

(51) Int. Cl.
*G11C 11/4091* (2006.01)

(52) U.S. Cl.
USPC .......................... 365/163; 365/148; 365/218

(58) Field of Classification Search
USPC ......................................................... 365/163
See application file for complete search history.

(56) References Cited

U.S. PATENT DOCUMENTS

| | | | |
|---|---|---|---|
| 5,761,115 A | 6/1998 | Kozicki et al. | |
| 6,141,274 A * | 10/2000 | Eto et al. | 365/203 |
| 6,487,106 B1 | 11/2002 | Kozicki | |
| 6,635,914 B2 | 10/2003 | Kozicki et al. | |
| 6,778,445 B2 * | 8/2004 | Ooishi et al. | 365/189.19 |
| 6,825,489 B2 | 11/2004 | Kozicki | |
| 6,847,570 B2 * | 1/2005 | Fujioka et al. | 365/222 |
| 7,106,614 B2 | 9/2006 | Symanczyk | |
| 7,126,152 B2 | 10/2006 | Ishida et al. | |
| 7,167,390 B2 | 1/2007 | Ishida et al. | |
| 7,209,379 B2 | 4/2007 | Mori et al. | |
| 7,239,542 B2 | 7/2007 | Ootsuka et al. | |
| 7,242,606 B2 | 7/2007 | Hachino et al. | |
| 7,359,236 B2 | 4/2008 | Gilbert | |
| 7,411,854 B2 | 8/2008 | Klostermann et al. | |
| 7,426,131 B2 | 9/2008 | Gilbert | |
| 7,457,145 B2 | 11/2008 | Kund et al. | |
| 7,514,706 B2 | 4/2009 | Gilbert | |
| 2006/0139989 A1 | 6/2006 | Gruning Von Schwerin et al. | |
| 2006/0265548 A1 | 11/2006 | Symanczyk et al. | |
| 2008/0002481 A1 * | 1/2008 | Gogl et al. | 365/189.06 |
| 2010/0195370 A1 | 8/2010 | Shiimoto et al. | |
| 2012/0117317 A1 * | 5/2012 | Sheffler et al. | 711/103 |

OTHER PUBLICATIONS

U.S. Appl. No. 13/315,652, filed Sep. 12, 2011 by Jameson et al.
U.S. Appl. No. 13/408,367, filed Feb. 29, 2012 by Hollmer et al.
U.S. Appl. No. 13/276,763, filed Oct. 19, 2011 by Jameson et al.

* cited by examiner

*Primary Examiner* — Son Mai

(57) ABSTRACT

A memory device can include at least one array comprising a plurality of elements programmable between at least two different states, each state having a different time to a change in property under applied sense conditions; a read circuit configured to apply the sense conditions to selected elements and detect changes in property of the selected elements to generate read data; a latch circuit configured to store read data from the read circuit; and a transfer path configured to provide a parallel data transfer path between the read circuit and the latch circuit.

18 Claims, 22 Drawing Sheets

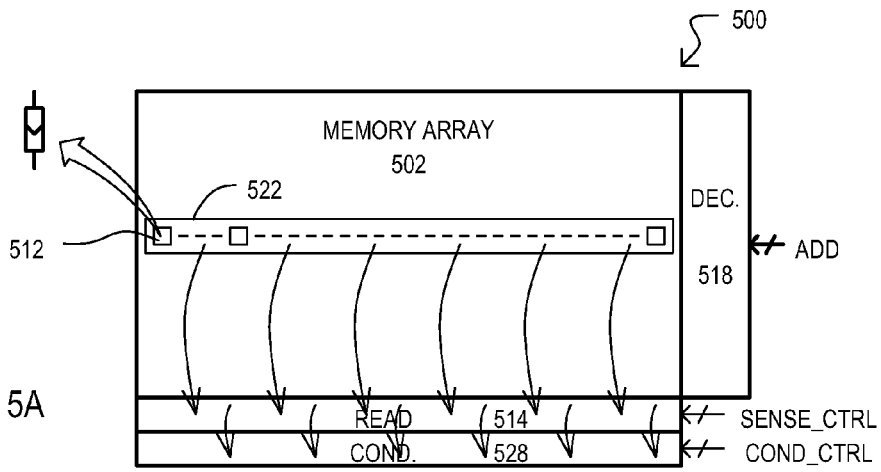
FIG. 5A
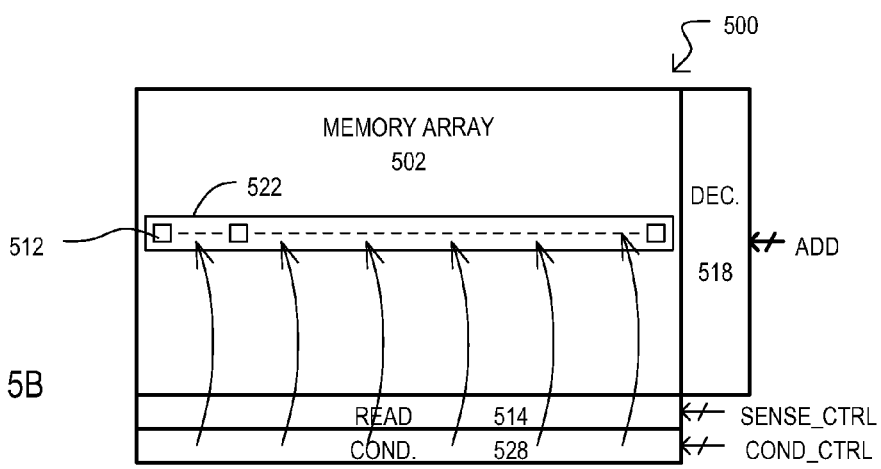
FIG. 5B
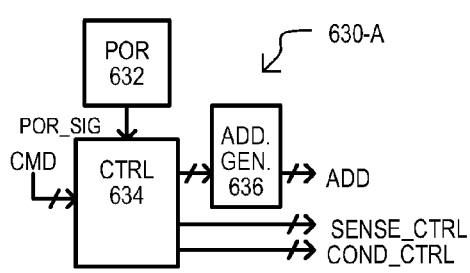 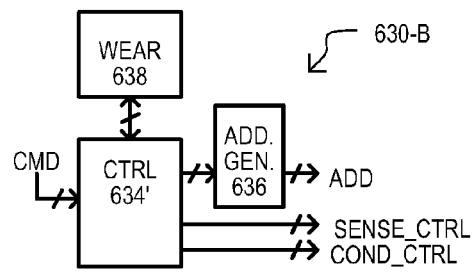
FIG. 6A          FIG. 6B (PRE-SENSE)

(POST-SENSE)

(POST-CONDITIONING)

US 8,854,873 B1

MEMORY DEVICES, ARCHITECTURES AND METHODS FOR MEMORY ELEMENTS HAVING DYNAMIC CHANGE IN PROPERTY

This application claims the benefit of U.S. provisional patent application Ser. No. 61/482,742, filed on May 5, 2011, the contents of which are incorporated by reference herein.

TECHNICAL FIELD

The present disclosure relates generally to memory devices, and more particularly to memory devices having elements programmable to exhibit a change in property when data sensing conditions are applied.

BACKGROUND

Memory devices typically include memory elements for storing data. "Flash" electrically erasable and programmable read only memories (EEPROMs) include an electrical storage gate layer for altering a transistor threshold voltage. Thus, such devices sense data values based on a static transistor threshold voltage.

Devices having one time programmable elements, such as "anti-fuse" elements, can program an element by creating a non-reversible conductive path. Thus, such devices may sense data values based on a static resistance of the cell.

Conventional conductive bridge random access memories (CBRAMs) can include memory elements (sometimes referred to as programmable metallization cells, PMCs) that may be programmed (or erased) to different resistance levels. Many PMC cells can have a metal-insulator-metal (MIM) structure. In one state (e.g., erased), substantially no current can flow through the MIM structure. In another state (e.g., programmed), a conductive path can be formed through the insulator layer. Accordingly, such memory devices may sense data values based on a resistance of a storage element (e.g., PMC).

In all of these conventional examples, the sense operations measure a property of the memory cell (e.g., threshold voltage, path conductivity) that remains substantially unchanged over the duration of the operation.

BRIEF DESCRIPTION OF THE DRAWINGS

FIGS. 5A and 5B are block schematic diagrams showing a memory device and operations having wide width data transfers for groups of time-to-change memory elements, and a conditioning circuit that can return memory elements to pre-sense states, according to an embodiment.

FIGS. 6A and 6B are block schematic diagrams showing circuits and methods for controlling conditioning circuits according to embodiments.

DETAILED DESCRIPTION

Below embodiments show methods, devices, and circuits for operating with memory elements that store data values based on a timed change in a property of a memory element. When subject to sensing conditions, elements programmed to one data value can exhibit a change in property within a given time period, while elements programmed to other data values can exhibit a change after the time period, or not change at all.

Such changes in property can be reversible, as well as multistate (more than two different states).

In some embodiments, a memory device having time-to-change elements can have circuits for transferring a large number data values (i.e., N-bits) in parallel between a latch circuit and memory cell array. Read and/or write operations, can access smaller portions of the N bits, by accessing locations within the latch circuit storing the N-bits. Latch circuits can provide rapid access to data value locations therein.

In other embodiments, a memory device having time-to-change elements can include "conditioning" circuits. Conditioning circuits can condition elements after they are sensed, and can substantially restore memory elements to states prior to such sensing operations. That is, if a sense operation results in a memory element changing from a first property to a second property, conditioning circuits can return such a memory element to the first property. Conditioning operations can be performed in response to read operations to the memory device, or in response to other events, including events independent of read or other access operations.

In further embodiments, a memory device having time-to-change elements can include differential sensing circuits that can sense data in one memory element by comparing its time-to-change in property with that of another memory element, or a generated reference signal.

In particular embodiments, a change in property can involve a dynamic change in conductivity when sense conditions are applied.

Figure 1:
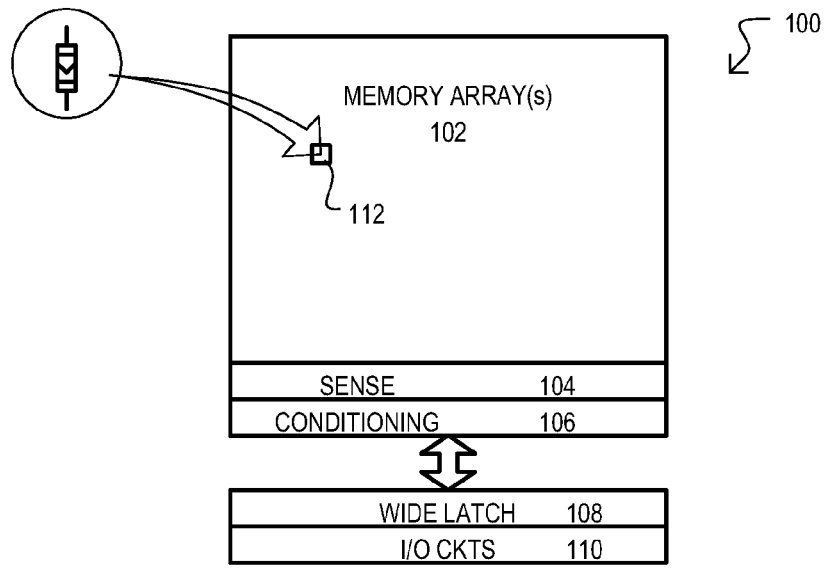
FIG. 1 is a block schematic diagram of a memory device having time-to-change memory elements according to one embodiment.

FIG. 1 shows a memory device 100 according to an embodiment. A memory device can form all or part an integrated circuit, or can be realized by a number of integrated circuit devices. A memory device 100 can include one or more memory cell arrays 102, with each memory cell array 102 including elements (one shown as 112) that can be programmed between two or more different states, where each state corresponds to a different time-to-change in property under the same sense conditions. In some embodiments, elements can be connected to bit lines by access devices, while in other embodiments elements can have direct electrical connections to lines (e.g., a cross-point array type architecture).

Referring still to FIG. 1, a memory device 100 can include any of: a differential sensing circuit 104, conditioning circuits 106, wide latch circuits 108, or an input/output (I/O) circuit 110. More detailed descriptions of such sections, according to very particular embodiments, as well as methods related to such sections will be described below.

FIGS. 2A to 2D show an example of a memory device 200 and related operations according to an embodiment. Memory device 200 can include one or more memory cell arrays 202, a latch circuit 208, a parallel I/O circuit 210', a read circuit 214, a write circuit 216, a group decoder circuit 218, and a select decoder circuit 220.

A memory cell array 202 can include memory elements (one shown as 212) that can exhibit a dynamic change in property under sense conditions, as described herein or equivalents. Memory cells (e.g., 212) within memory cell array 202 can be arranged into logical groups (one shown as 222) selectable by group decoder circuit 218. Selectable memory cell groups (e.g., 222) can include a relatively large number of memory cells selected in parallel. Groups can include greater than 64 memory cells, more particularly, greater than 128 memory cells.

In some embodiments, memory cells (e.g., 212) can be dynamic resistance cells that can exhibit a change in resistance under sense conditions. For example, under sense conditions memory cells programmed to one value can dynamically change from a relatively high resistance to a relatively low resistance within a sense period, while memory cells programmed to other values can exhibit a change in resistance after the sense period, or not at all.

In very particular embodiments, memory cells (e.g., 212) can include one or more solid ion conducting layers formed between two electrodes. Solid ion conducting layers can include, but are not limited to, a chalcogenide and/or a metal oxide.

A read circuit 214 can detect dynamic changes in properties of a selected group of memory cells under sense conditions, and generate output data value from such detected changes. A read circuit 214 can have a data width sufficient to sense an entire memory cell group (e.g., 222) in parallel. A read circuit 214 can sense a change in properties based on electrical signals, and can include, but is not limited to: voltage sensing, current sensing, or combinations thereof.

A write circuit 216 can apply write conditions (e.g., program conditions) that place memory cells into a particular state (i.e., a state establishing a time-to-change in property). In one embodiment, a write circuit 216 can have a data width sufficient to write data to an entire memory cell group (e.g., 222) in parallel. In alternate embodiments, a write circuit 216 can have a smaller bit width than a memory cell group (e.g., 222), and so may write data to the memory cell group in more than one data write operation.

A latch circuit 208 can have a data width sufficient to store data equivalent to a memory cell group (e.g., 222). A latch circuit 208 can be connected to a read circuit 214 and a write circuit 216 by a data transfer path 224. Data transfer path 224 can have the same or greater data width (xN) than latch circuit 208. It is understood that a latch circuit 208 can include any suitable storage circuits for capturing data sensed by read circuit 214, including basic latches, registers (clocked or unclocked), or sample and hold circuits, as but a few examples.

Parallel I/O circuit 210' can input data to and output data from a latch circuit 208 in response to a select decoder circuit 220. An I/O data path 226 can provide a data path to locations external to a memory device 200, or to other sections of a larger integrated circuit that includes memory device 200.

In the particular embodiment shown, a data width of I/O data path 226 (xP) is smaller than that of data transfer path 224 (i.e., P<N). In some embodiments, an I/O data path 226 can have lines that serve as both input and output data paths (i.e., are bi-directional). However, in other embodiments an I/O data path 226 can include a unidirectional input data path, a unidirectional output data path, or both.

Figure 2A:
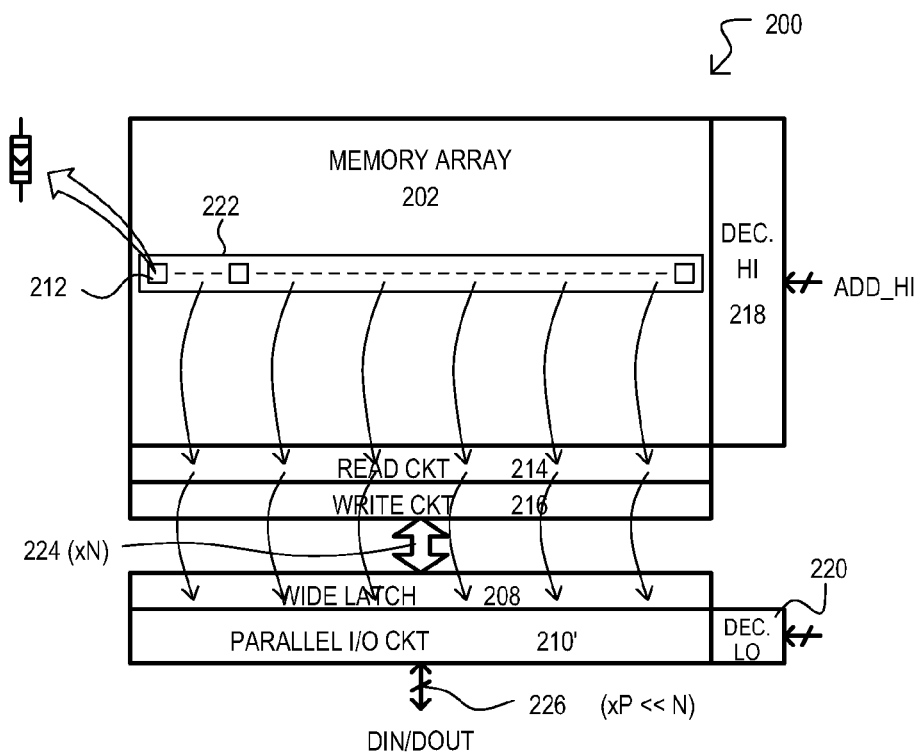
FIGS. 2A to 2D are block schematic diagrams showing a memory device and corresponding operations having wide width data transfers for groups of time-to-change memory elements.
Figure 2B:
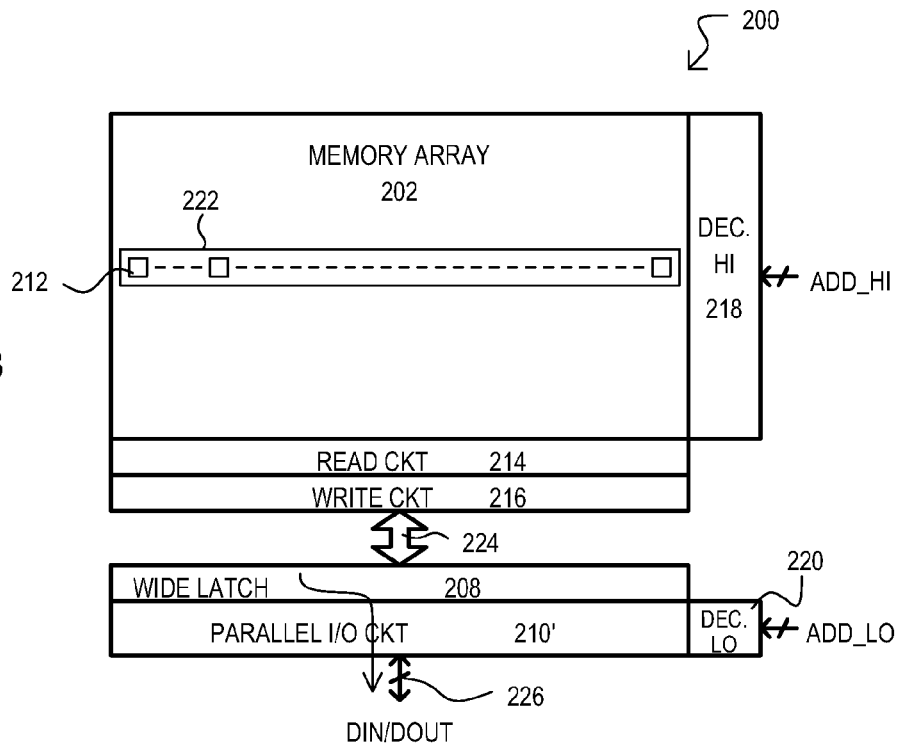

FIGS. 2A and 2B show a read operation for a memory device 200 according to one embodiment.

Referring to FIG. 2A, in response to address value ADD_HI, a read memory cell group (e.g., 222) can be accessed. Read circuit 214 can apply sense conditions to memory cells of the selected group (212), to thereby sense data values from such memory cells in a highly parallel fashion (e.g., greater than 64-bits, greater than 128-bits, etc.). Sensed data values of the selected group (e.g., 222) can be transferred in parallel to latch circuit 208, and stored therein.

Referring to FIG. 2B, in response to address value ADD_LO, a portion of read data stored within latch circuit 208 can be output as read data. In some embodiments, read data can be accessed in a sequence of multiple bit values (P-bits), where P<N. In a very particular embodiment, such multi-bit values can include any of: nibbles (4-bits), bytes (8-bits), double bytes (16-bits), words (32-bits), or double words (64-bits, assuming N>64).

In one embodiment, ADD_HI and ADD_LO can be portions of a same applied read address. In other embodiments, ADD_LO can be a sequence of addresses (e.g., a burst) generated from an initial base address value.

Figure 2C:
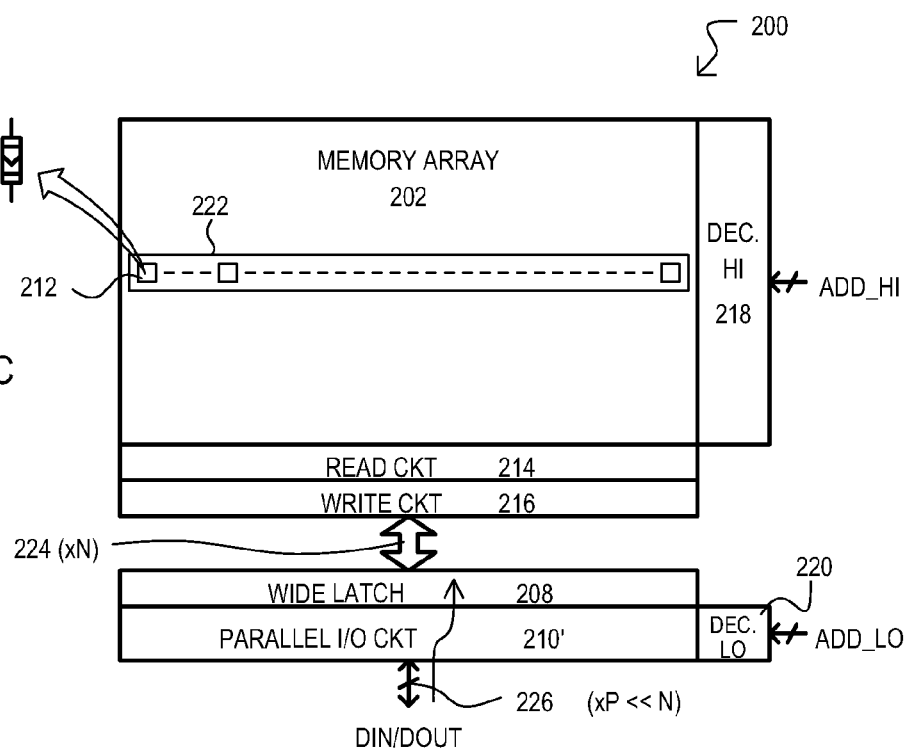
Figure 2D:
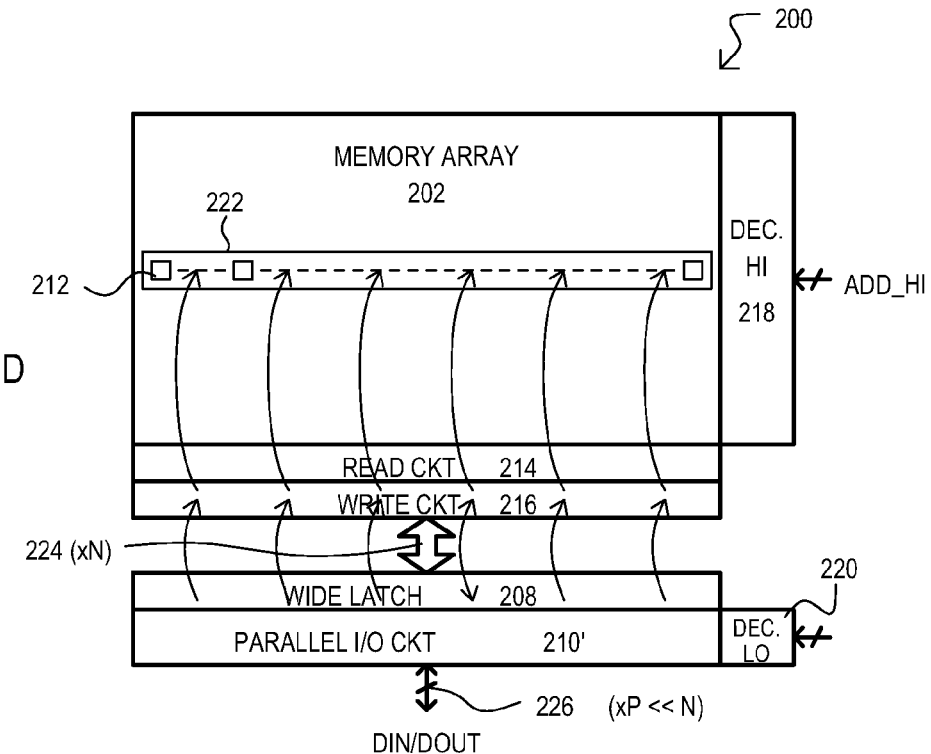

FIGS. 2C and 2D show a write operation for memory device 200 according to one embodiment. In the embodiment of FIGS. 2C and 2D it is assumed that a previous read operation has stored data values for group 222 in latch circuit 208.

Referring to FIG. 2C, in response to address values ADD_LO, write data received on data transfer path 226 can be stored in latch circuit 208. Such data can overwrite data previously read into latch circuit 208. While write operations are directed to the memory cell group 222 (which can correspond to ADD_HI), data can continue to be written to latch circuit 208 according to ADD_LO. That is, in some embodiments or operations, latch circuit 208 can first capture write data for more than one portion of memory cell group 222, and then can subsequently write data for the whole cell group 222 in one parallel write action.

Referring to FIG. 2D, in response to address value ADD_HI, memory cell group 222 can be selected. Data stored in latch circuit 208 can be transferred in parallel (xN) into write circuit 216. Write circuit 216 can write such write data values in parallel (xN) into memory cell group 222.

As noted above, in some embodiments address values ADD_HI and ADD_LO can be different portions of a same address, or ADD_LO can be a sequence of generated addresses.

Figure 3A:
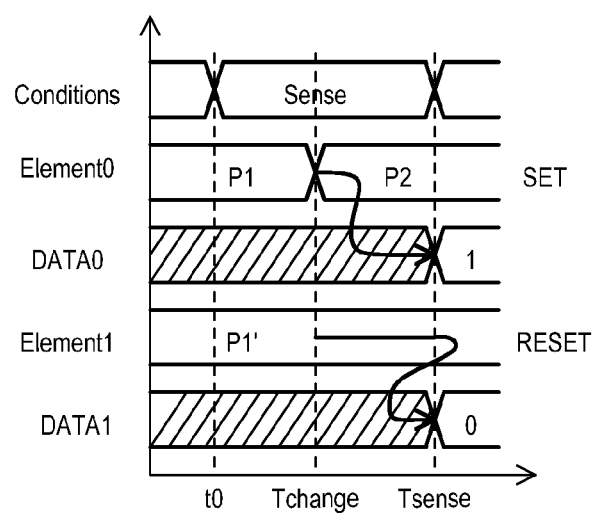
FIGS. 3A to 3C diagrams showing a time-to-change response of elements during sense operations, according to embodiments.
Figure 3B:
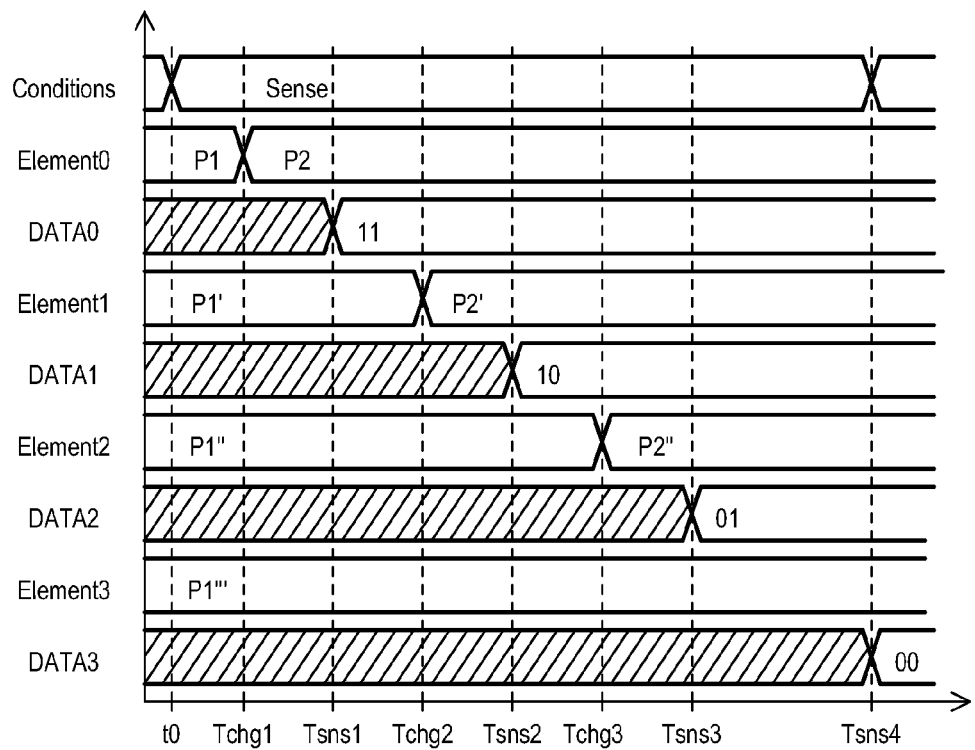

FIGS. 3A and 3B show sense operations of memory elements according to embodiments.

FIG. 3A is a timing diagram showing the following waveforms: "Conditions" corresponds to conditions applied to two memory elements (Element0 and Element1); "Element0" shows a property response of an element having one state (e.g., SET); "Element1" shows a property response of an element having a second state (e.g., RESET); "DATA0" shows a sensed data value corresponding to Element0; and "DATA1" shows a sensed data value corresponding to Element1.

Referring to FIG. 3A, at about time t0, a sense operation can start as sense conditions (Sense) are applied to the memory elements. At this time, a property of both elements can have initial values P1 and P1'. It is noted that P1 can be the same as P1' or can be different than P1'. In some embodiments, absolute values of properties cannot be determined as only changes property over time can represent data states.

At time Tchange, Element0 can undergo a change in property, changing from property P1 to property P2. However, Element1 does not undergo such a change, maintaining property P1'.

At time Tsense, because Element0 underwent a change in property, it can generate one output data value (in this case "1"). However, because Element1 did not undergo a change in property, it can generate another output data value (in this case "0").

While FIG. 3A shows element programmable into two different states (SET and RESET) other embodiments can include memory elements programmable into more than two states, with each state corresponding to a different time-to-change in property under same sense conditions. One such embodiment is shown in FIG. 3B.

FIG. 3B is a timing diagram showing one very particular embodiment in which memory elements can be programmed into four states, each having a different time to change under the same sense conditions. FIG. 3B shows the following waveforms: "Conditions" shows the application of sense conditions (Sense); "Element0" shows a response of an element programmed to a first state; "DATA0" shows sensed data value corresponding to Element0; "Element1" shows a response of an element programmed to a second state; "DATA1" shows sensed data value corresponding to Element1; "Element2" shows a response of an element programmed to a third state; "DATA2" shows sensed data value corresponding to Element2; "Element3" shows a response of an element programmed to a fourth state; "DATA3" shows sensed data value corresponding to Element3.

As shown in FIG. 3B, under the sense conditions "Sense", at about time Tchng1, Element0 undergoes a change in property (P1 to P2). At time tsns1 such a change is detected, indicating one data value (shown as DATA0=11).

In a similar fashion, memory elements Element1 and Element2 undergo changes in property at times following Tchng2 and Tchng3, respectively. At time tsns2, the change in Element1 is detected, resulting in one date value (shown as DATA1=10). At time tsns3, the change in Element2 is detected, resulting in a third data value (shown as DATA2=01).

In contrast, in the particular embodiment shown, Element3 does not undergo a change in property by the end of the sense period (i.e., by time Tsns4), and thus can indicate a fourth data value (DATA3=00).

Figure 3C:
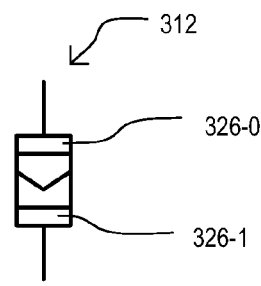

FIG. 3C is a schematic diagram showing a symbol corresponding to a time-to-change memory element 312. Such a symbol is used throughout this written description. In some embodiments, a memory element 312 can be a two terminal device having first and second electrodes (326-0/1) separated from one another by a memory material. In one very particular embodiment, a memory material can include one or more ion conducting layers as described herein, or equivalents. In very particular embodiments, a memory element can be programmable between two or more different times to change in conductivity.

Figure 4A:
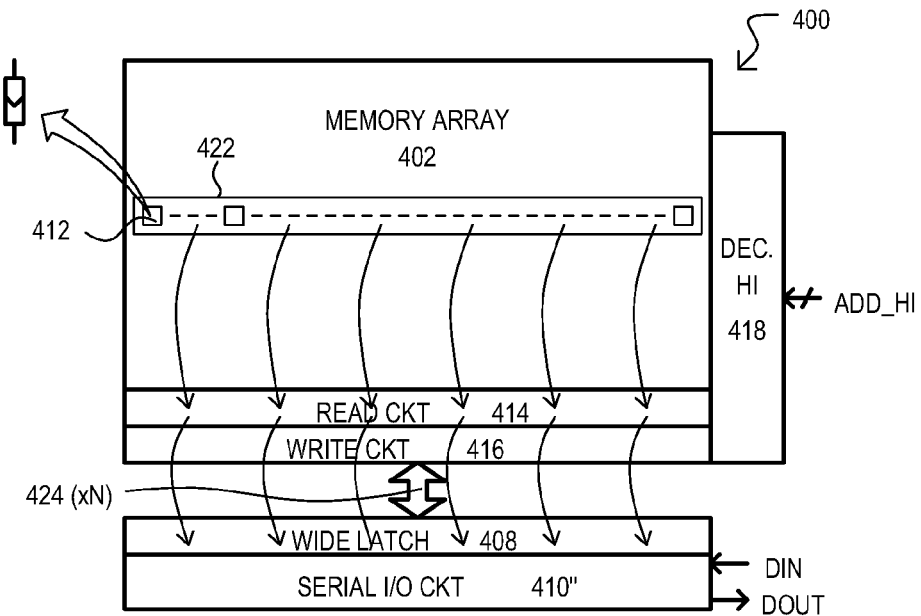
FIGS. 4A and 4B are block schematic diagrams showing a memory device and corresponding operations having wide width data transfers for groups of time-to-change memory elements, along with smaller data width input/output circuits, according to an embodiment.
Figure 4B:
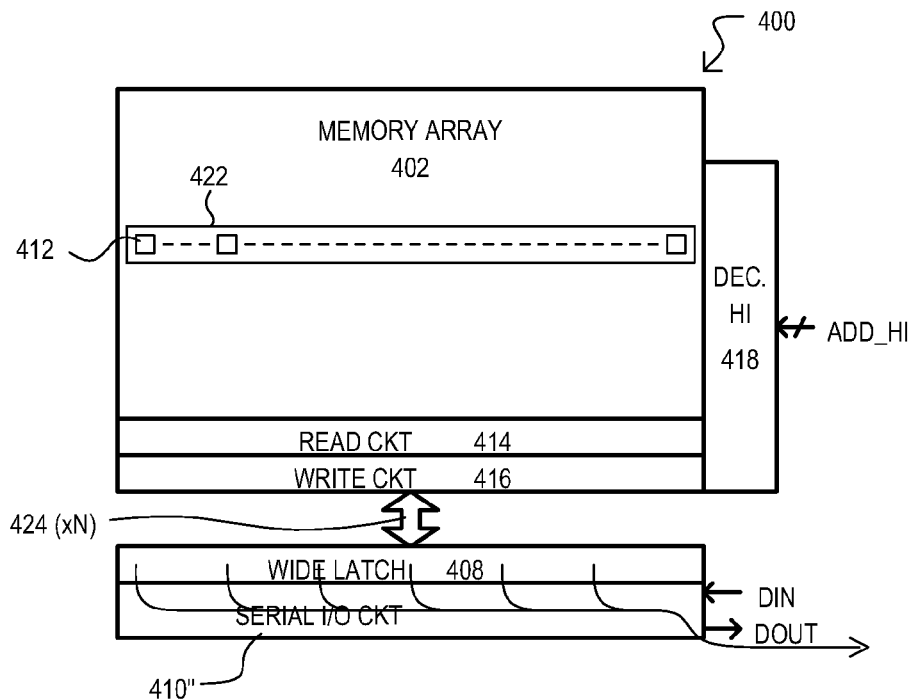

FIGS. 4A and 4B show another example of a memory device 400 according to an embodiment. Memory device 400 can include sections like those shown in FIGS. 2A to 2D, and such like sections are referred to by the same reference character but with the lead character being "4" instead of "2".

FIGS. 4A and 4B differ from FIGS. 2A to 2D in that memory device 400 can include a serial I/O circuit 410" instead of a parallel I/O circuit. A serial I/O circuit 410" can input data to, and output data from, a latch circuit 408 by way of one or more serial data streams. Thus, such a serial I/O circuit 410" can include any suitable serializer-deserializer (SERDES) circuits.

FIGS. 4A and 4B show a read operation for memory device 400. Read operations can occur in the same, or equivalent fashion, to that described for FIGS. 2A and 2B. However, once data values are stored within latch circuit 408, such data values can be output in a serial data stream via serial I/O circuit 410".

A write operation is understood from the above descriptions regarding read operations. In one embodiment, data can arrive at serial I/O circuit 410" in one or more serial data streams. Such data values can be stored in latch circuit 408. Write circuit 416 can write such data values within latch circuit 408 in parallel (xN) into memory cell group 422 selected by address values ADD_HI.

In some embodiments, a serial I/O circuit 410" can output data in response to a select decoder, like that shown as 220 in FIGS. 2A to 2D, with serial data being transferred in groups of less than N bits.

Highly parallel reading and writing operations, as described above, can enable a memory device having fast throughput and high read/write bandwidth, as large numbers of devices can be accessed in parallel.

As understood from above, memory elements in the embodiments shown herein can exhibit a dynamic change in property under sense conditions. Consequently, such sense operations can be transformative, changing an element with respect to its state prior to being sensed. As but one example, in very particular embodiments, prior to a sense operation an element can have low, or substantially no conductivity. However, a sense operation can result in some elements having substantially higher conductivity and/or a faster time-to-change response, as compared to such elements prior to being sensed.

In some embodiments, memory elements can also "drift" from one state to another, due to the inherent properties of the element and/or bias conditions applied to the elements (e.g., biases applied under standby conditions, or the like). Further, fields arising during standard operation of a memory device can adversely affect a memory element's state (e.g., disturb conditions). This too, can cause unwanted changes in element states. Finally, while in some embodiments memory elements can be substantially nonvolatile, in other embodiments, elements can change properties over time, unless the states of such elements are reinforced.

According to embodiments herein, memory devices can include "conditioning" circuits that apply electrical conditions that tend to return a sensed element to its pre-sense state and/or reinforce an element's present state to counteract any drift that can take place.

In some embodiments, conditioning circuits can be write circuits that apply write conditions to condition memory elements. In other embodiments, conditioning circuits can be circuits that apply electrical conditions different from write conditions. In still other embodiments, conditioning circuits can be separate from write circuits entirely.

FIGS. 5A and 5B show a memory device 500 according to an embodiment. Memory device 500 can include one or more memory cell arrays 502, a read circuit 514, a decoder circuit 518, and a conditioning circuit 528.

A memory cell array 502, read circuit 514, and decoder circuit 518 can take the form of those shown as 202 and 214 in FIGS. 2A to 2D, or equivalents. However, a read circuit 514 can also provide sensed data values to conditioning circuit 528.

Conditioning circuit 528 can receive sensed data values from read circuit 514, and in response to such data values, condition a selected group of memory elements (e.g., 522). A conditioning operation can return memory elements to pre-sense states (i.e., reverse effects of a sense operation) and/or restore memory elements to "freshly" written states (i.e., place memory elements in a state equivalent to that following a write operation—thereby reversing wear, disturb or other effects that degrade memory elements over time). Conditioning operations can vary according to storage element type. In some embodiments, conditioning can include applying bias conditions opposite to those applied in a sense operation. Optionally, conditioning operations can include verifying some electrical feature of an element (e.g., conductance) to thereby ensure the desired state is achieved.

FIGS. 5A and 5B show a conditioning operation for memory device 500 that automatically follows a sense operation, according to a particular embodiment.

Referring to FIG. 5A, in response to a group select address (ADD) a memory cell group (e.g., 522) can be accessed. In response to sense controls signals SENSE_CTRL, read circuit 514 can apply sense conditions to memory cells of the selected group (522), to thereby sense data values from such values. Such a sense operation can alter a state of such memory elements, as noted above. As will be described below, such a sense operation can occur in response to a read command received by the memory device 500, or can occur in response to other conditions.

In some embodiments, sensed data values can be provided to conditioning circuit 528. Conditioning circuit 528 can then selectively apply bias conditions based on sensed data values. This is in contrast to other embodiments that can apply sense conditions regardless of sensed data values.

Referring to FIG. 5B, in response to the sense operations by read circuit 514, condition circuit 528 can condition the accessed memory cell group 522. As noted above, in some embodiments, conditioning operations are not data dependent. As but one example, a previous sense operation can apply a sense bias voltage across memory elements to sense dynamic changes in property. A subsequent conditioning operation can apply an opposing bias voltage to the memory elements, regardless of whether or not such memory elements undergo a change in property.

However, in other embodiments, conditioning operations can be data dependent. As but one example, conditioning circuit 528 can vary conditions applied to an element according to a value stored by such an element. In very particular embodiments, conditioning circuits 528 can applying bias conditions that write and/or reinforce sensed data values back into the memory elements.

As noted above, in some embodiments, conditioning operations can occur in response to a data read operation. However, in addition or alternatively, conditioning operations can occur under other circumstances. Particular examples of conditioning control circuits are shown below.

FIGS. 6A and 6B show conditioning control circuits according to particular embodiments.

FIG. 6A shows a conditioning control circuit 630-A that can include a power on reset (POR) circuit 632, a controller circuit 634, and an address generator circuit 636. A POR circuit 632 can detect when power is applied to a device to which power had previously been cut-off (power-on) or when such a device is reset. POR circuit 632 can provide one or more POR indications (POR_SIG) to a controller circuit 634.

A controller circuit 634 can receive indications (POR_SIG) from POR circuit 632. When such indications signify a power-on and/or reset condition, controller circuit 634 can generate signals to control address generator 636 to generate a sequence of addresses ADD. Such addresses can access groups of memory cells for conditioning operations. Controller circuit 634 can also generate conditioning control signals COND_CTRL, which can control the operation of conditioning circuits (e.g., 528). In embodiments that perform conditioning operations based on stored data values, a controller circuit 634 can also generate sense control signals SENSE_CTRL that can control a read circuit (e.g., 514).

In the embodiment shown, a controller circuit 634 can also receive command information (CMD), indicating a requested operation (e.g., READ, WRITE, etc.). In response to predetermined command, a conditioning operation can be performed.

A controller circuit 634 can take the form of custom logic circuits, a processor that executes a sequence of predetermined instructions, or combinations thereof, as but a few examples.

FIG. 6B shows a conditioning control circuit 630-B that can include items like those shown in FIG. 6A, and such like items are referred to by the same reference characters.

FIG. 6B differs from that of FIG. 6A in that a controller circuit 634' can access a wear monitoring circuit 638 to determine when conditioning operations are to be performed. A wear monitoring circuit 638 can track accesses (e.g., reads and/or writes) to particular locations within a memory cell array (e.g., 502). A wear monitoring circuit 638 can indicate when cumulative accesses to a portion of a memory array (e.g., 502) approach some limit. In response, a controller circuit 634' can perform a conditioning operation on such a portion.

Figure 7A:
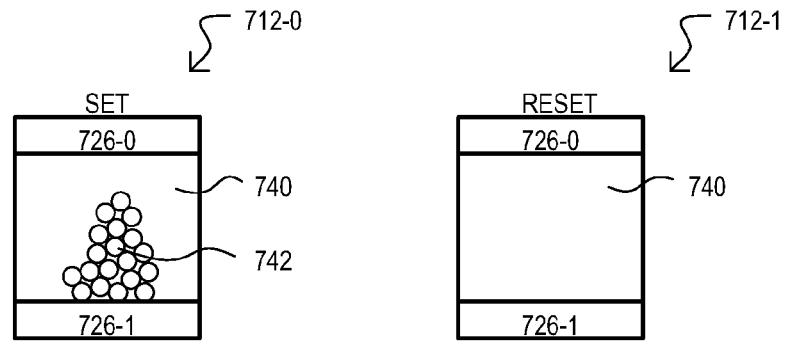
FIGS. 7A to 7C are diagrams showing sense and conditioning operations for time-to-change memory elements according to an embodiment.
Figure 7B:
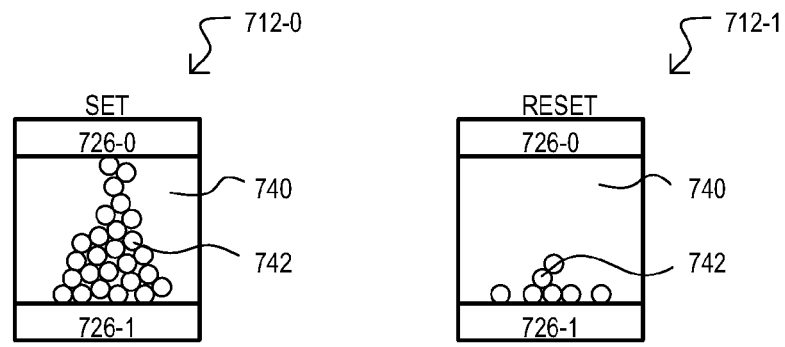
Figure 7C:
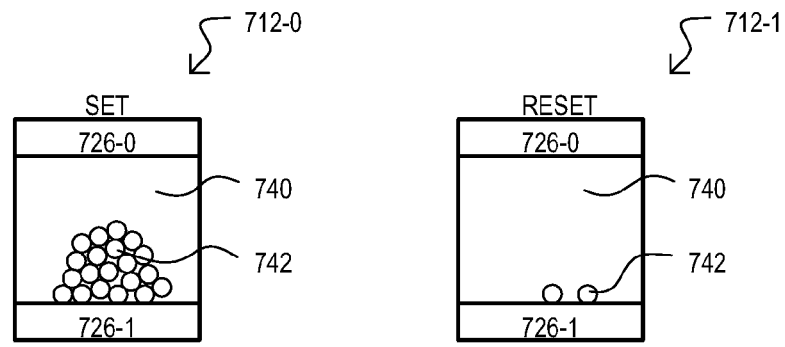

FIGS. 7A to 7C are representations showing a response of one very particular type of memory element according to an embodiment. Such a memory element can exhibit a dynamic change in conductivity under sense conditions, and can be written to a SET state or a RESET state. A SET state can have a shorter time-to-change in conductivity than the RESET state.

FIGS. 7A to 7B show a memory element written (e.g., programmed) to the SET state 712-0 and a memory element written to the RESET state 712-1. Each memory element can include a first electrode 726-0 separated from a second electrode 726-1 by a memory material 740. A memory material 740 can form conductive paths when subject to a bias conditions. Such conductive paths can be reduced and/or removed with the application of opposing bias conditions.

Referring to FIG. 7A, prior to a sense operation, a SET element 712-0 can have a partially formed conductive path 742 formed in memory material 740. In contrast, a RESET element 712-1 can have little or no such conductive path. It is noted that FIGS. 7A to 7C are but representations of an element. Conductive paths (742) can take various forms, and can be contiguous or not contiguous, can be filaments, and can extend from one electrode or both electrodes.

Referring to FIG. 7B, following a sense operation, application of a sense conditions can result in SET element 712-0 dynamically changing its conductivity, with a conductive path 742 being formed between electrodes 726-0/1. Sense conditions applied to RESET element 712-1 may form some conductive structures 742 within memory material 740, but not enough to create as large a conductivity change as the SET element 712-0.

Referring to FIG. 7C, following a conditioning operation, both SET and RESET elements (712-0/1) can be returned to substantially a same state prior to sensing (e.g., state like that of FIG. 7A). As noted above, a conditioning operation can include applying bias conditions opposite to that utilized in a sense operation.

FIGS. 8A to 8G are graphs showing conditioning operations according to various embodiments.

Figure 8A:
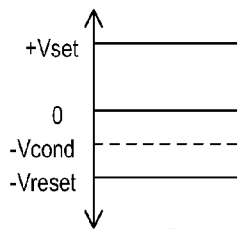
FIGS. 8A to 8G are diagrams showing various conditioning operations for time-to-change memory elements according to embodiments.

FIG. 8A shows bias voltages (+Vset, −Vcond, −Vreset) for various operations according to one particular embodiment. It is understood that a polarity of such voltages can be taken with respect to terminals of a memory element. A memory element can be placed into one state (a SET state) by application of a bias voltage+Vset. In one embodiment, a SET state can be state that results in a property change under sense conditions. Even more particularly, a SET state can result in a dynamic change to a lower conductance from a higher conductance under the sense conditions A memory element can be placed into another state (a RESET state) by application of a bias voltage−Vreset. In one embodiment, a RESET state can be state that results in substantially no property change under sense conditions. As shown, a bias voltage−Vreset can have an opposite polarity with respect to bias voltage+Vset.

A conditioning operation can apply a bias voltage −Vcond to memory elements. In the particular embodiment shown, a conditioning voltage −Vcond can have the same polarity as −Vreset, but a lower magnitude.

Figure 8B:
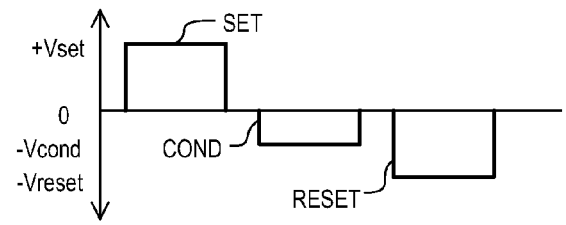

FIG. 8B shows pulses that can be applied to memory elements in various operations according to an embodiment. FIG. 8B shows magnitudes like those of FIG. 8A. A pulse SET can place a memory element into the SET state. A pulse RESET can place a memory element into the RESET state. A pulse COND can place a memory element into the COND state.

It is understood that the pulses shown in FIG. 8B can be repeatedly applied in program operations (i.e., operations that place a memory element into a SET or RESET state) and conditioning operations. Further, durations and/or numbers of such pulses can vary according to memory element response.

Figure 8C:
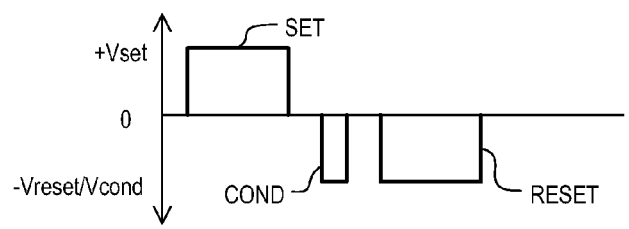

FIG. 8C shows pulses that can be applied to memory elements in various operations according to another embodiment. FIG. 8C shows pulses like those of FIG. 8B, however, a conditioning pulse (COND) can have a same magnitude as a RESET pulse, but a shorter duration than that shown in FIG. 8B.

It is understood from FIGS. 8B and 8C that a magnitude and/or duration of a conditioning pulse can be adjusted to arrive at a desired conditioning response.

Figure 8D:
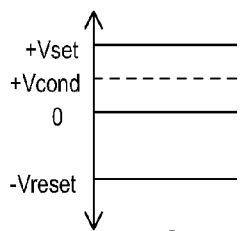
Figure 8E:
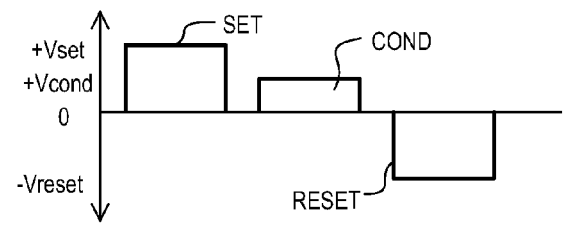
Figure 8F:
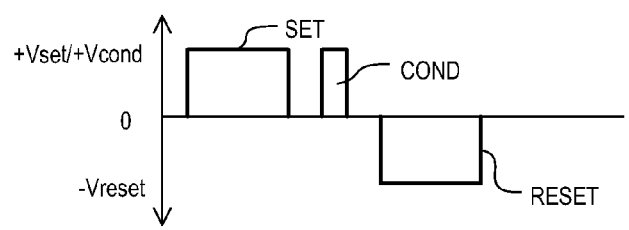

It is understood that while FIGS. 8A to 8C have shown conditioning pulses that can tend to reinforce a RESET state (e.g., a state that does not undergo a change in property, or takes longer to change than the SET state), alternate embodiments can reinforce the SET state. FIGS. 8D to 8F show conditioning pulses that can be applied to memory elements. FIGS. 8D to 8F can correspond to FIGS. 8A to 8C, but show an embodiment in which conditioning pulses reinforce the SET state.

Figure 8G:
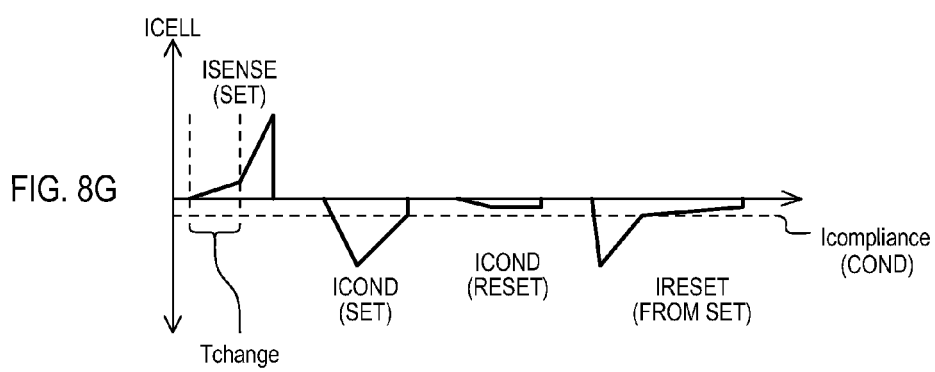

FIG. 8G shows cell current responses to various operations according to a particular embodiment.

Waveform ISENSE(SET) shows current through a memory element in a sense operation. Upon application of a sense voltage, a current can flow, at a relatively slow rate. After a time Tchange, a conductivity of the memory element can increase, resulting in an increase in current. In the embodiment shown, once an increase in current is detected, it can be cutoff.

Waveform ICOND(SET) shows a current through a memory element in a conditioning operation, where the memory element was in a SET state and subject to a sense operation (resulting in a change in conductance). In the embodiment shown, upon application of a conditioning bias, a current through an element can increase, but then fall as the conductance of the memory element decreases (i.e., it returns to its state prior to being sensed). In the embodiment shown, once a memory element current reaches a compliance level (Icompliance), the conditioning operation can cease.

Waveform ICOND(RESET) shows a current through a memory element in a conditioning operation, where the memory element was in a RESET state and subject to a sense operation (resulting in little or no change in conductance). In the embodiment shown, upon application of a conditioning bias, a current through an element can remain substantially small, as the conductance of the memory element remains low.

Waveform IRESET(FROM SET) shows a current through a memory element in a program operation where the memory element was in a SET state and subject to a sense operation (resulting in a change in conductance). In the embodiment shown, upon application of a bias voltage, like the conditioning operation, a current through an element can increase and then fall, as the conductance of the memory element decreases. However, unlike the conditioning operation, a bias can continue to be applied even after the compliance level (Icompliance) is reached.

It is noted that while FIGS. 5A and 5B show a memory device that can perform conditioning operations in a wide parallel fashion, other embodiments can perform conditioning on one portion of an array while another is being accessed. One such embodiment is shown in FIGS. 9A and 9B.

Figure 9A:
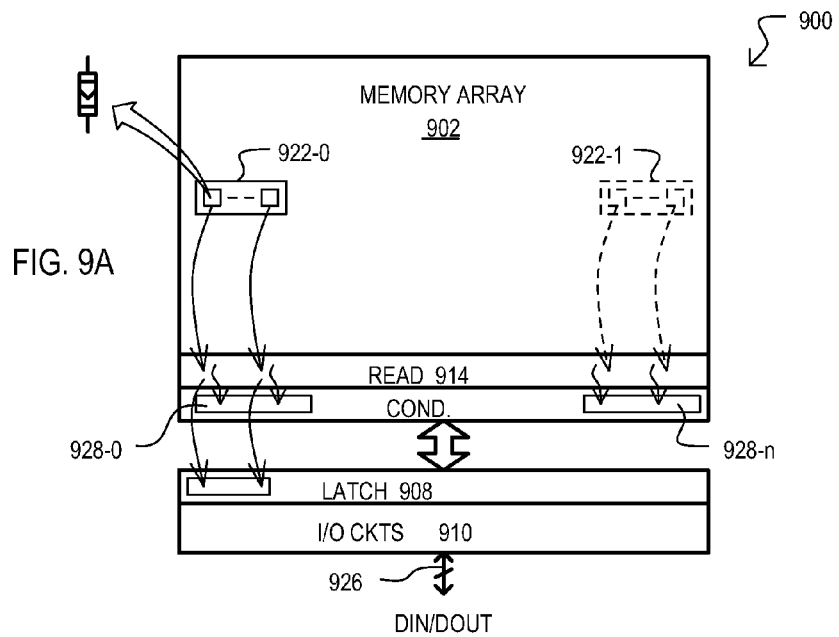
FIGS. 9A and 9B are block schematic diagrams showing a memory device and corresponding operations having circuits that condition time-to-change memory elements that are not accessed in sensing operation, according to an embodiment.
Figure 9B:
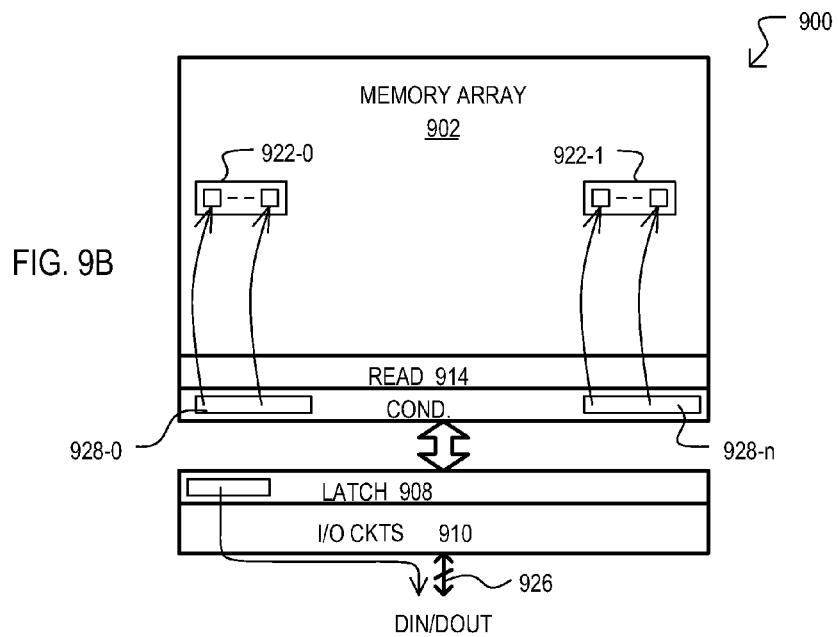

FIGS. 9A and 9B show a memory device 900 according to a further embodiment. Memory device 900 can include sections like those shown in FIG. 5A, and such like sections are shown with a same reference character but with the first character being "9" instead of "5".

FIGS. 9A and 9B differ from FIG. 5A in that a conditioning circuit can include multiple sections 928-0 to 928-n that can operate independently on separate memory cell groups (e.g., 922-0 and 922-1). Further, a latch circuit 908 and I/O circuit 910 are also shown. Latch circuit 908 can store read data sensed by read circuit 914. I/O circuit 910 can enable a read data output path from latch 908 to data path 926.

FIGS. 9A and 9B show a read and conditioning operation to one memory cell group 922-0, while another memory cell group 922-1 is independently conditioned.

Referring to FIG. 9A, in response to a read operation, a memory cell group 922-0) can be accessed. Read circuit 914 can apply sense conditions to the selected group 922-0. In the embodiment shown, data read from group 922-0 can be transferred to latch 908. Optionally, data values read from group 922-0 can be provided to conditioning section 928-0.

Independently, another memory cell group 922-1 can be accessed (i.e., the read operation to group 922-0 is not directed to group 922-1). Optionally, data values read from group 922-1 can be provided to conditioning section 928-n.

Referring to FIG. 9B, conditioning section 928-0 can condition memory cells in group 922-0. Similarly, conditioning section 928-n can condition memory cells in group 922-1. In some embodiments, such conditioning can vary in response to sensed values. In other embodiments, conditioning can be independent of sensed data values. In addition, data from group 922-0, previously stored in latch 908, can be output on data path 926.

Figure 10A:
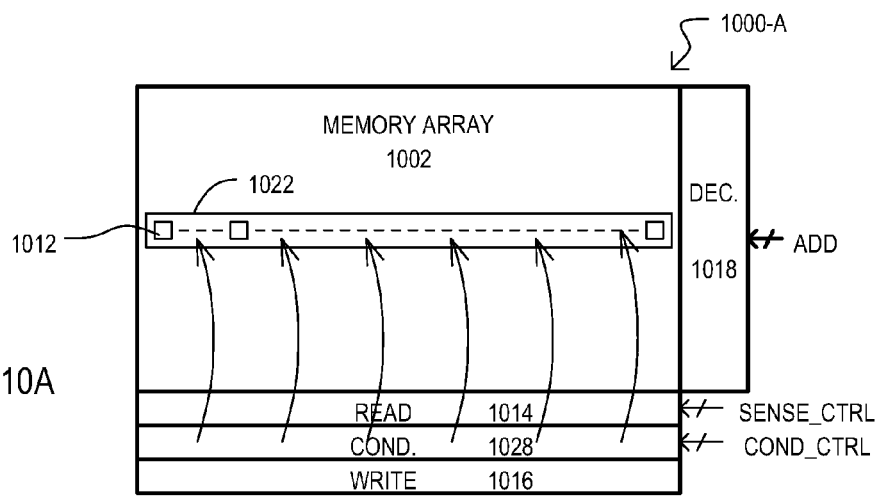
FIGS. 10A and 10B are block schematic diagrams showing a memory device and corresponding operations having write circuits that are different than conditioning circuits, according to an embodiment.
Figure 10B:
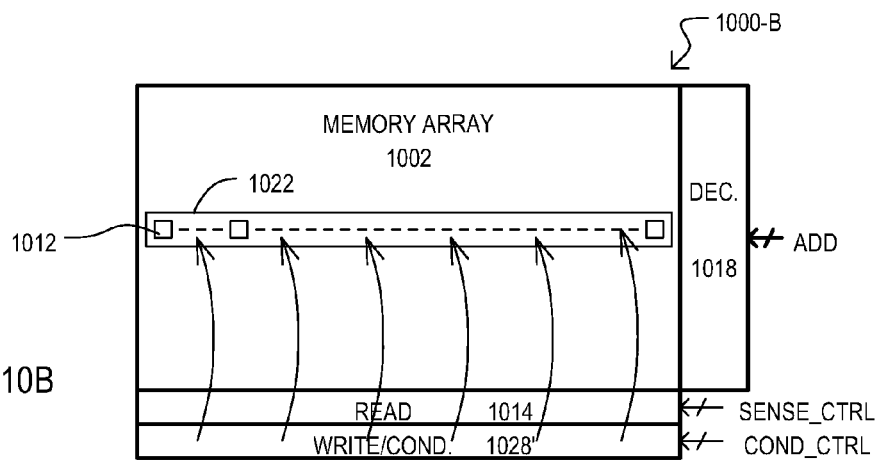

FIGS. 10A and 10B show memory devices 1000-A/B according to further embodiments. Memory devices 1000-A/B can include sections like those shown in FIG. 5A, and such like sections are shown with a same reference character but with the first characters being "10" instead of "5".

The embodiment of FIG. 10A differs from FIG. 5A in that a conditioning circuit 1028 is shown to be a separate circuit from write circuit 1016. FIG. 10A shows a conditioning operation in which a memory cell group 1022 can be conditioned to a state prior to being sensed. As in the embodiments above, conditioning operations can return memory elements (e.g., 1012) back to states prior to a sensing operation. A conditioning operation can be selective, being based on sensed data valued. In addition or alternatively, a sense operation can be non-selective, conditioning elements regardless of their stored data value.

The embodiment of FIG. 10B differs from FIG. 5A in that a conditioning circuit 1028' can be a write circuit. Thus, in a write operation, a write/conditioning circuit 1028' can apply write (e.g., program) electrical conditions that vary according to a data value to be stored. In contrast, in a conditioning operation, write/conditioning circuit 1028' can apply electrical conditions different from write conditions. In particular embodiments, in conditioning operations electrical conditions can impart less energy (e.g., lower voltage/current magnitude, shorter duration, fewer pulse numbers) as compared to the write conditions.

While the above embodiment have shown devices and corresponding methods, additional method embodiments will now be described with reference to a number of flow diagrams.

Figure 11:
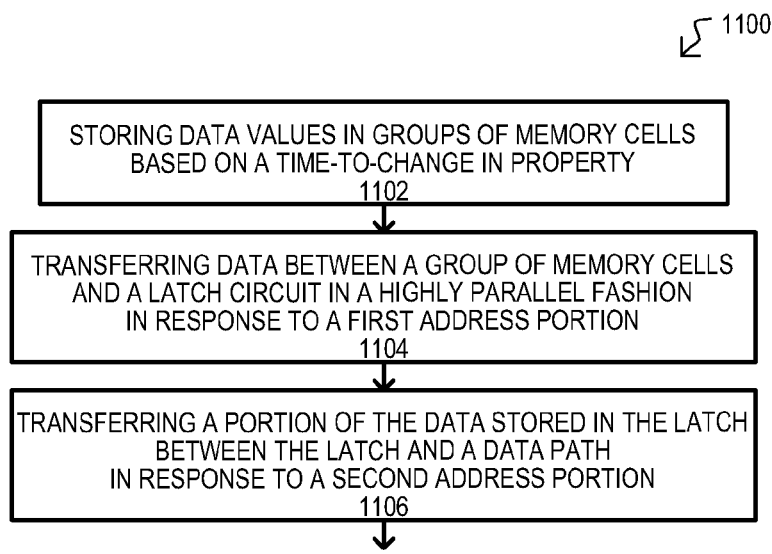
FIG. 11 is a flow diagram of a method according to an embodiment.

FIG. 11 shows a method according to an embodiment. A method 1100 can include storing data values in groups of memory cells (1102). Such an action can include storing data in time-to-change elements according to any suitable embodiment described herein, or an equivalent. Data can be transferred between a group of memory cells and a latch circuit in a highly parallel fashion. Such transfers can occur in response to a first address portion (1104). Such highly parallel data transfers can include relatively large bit widths, such as bit widths greater than 64-bits, even more particularly, greater than 128 bits. Portions of data stored in the latch can be transferred to a data path in response to a second address portion (1106). Such transfers can occur at a high speed.

Figure 12:
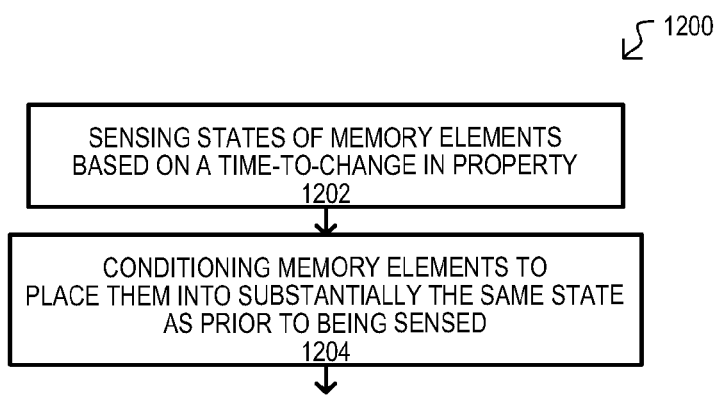
FIG. 12 is a flow diagram of another method according to another embodiment.

FIG. 12 shows a method according to another embodiment. A method 1200 can include sensing states of memory elements based on a time-to-change in property (1202). Such an action can include determining data values based on a change in property caused by sense conditions (or failure of such an element to have a change in property under the sense conditions). In one particular embodiment, a dynamically changing property can include conductivity.

A method 1200 can also condition memory elements to place them into substantially a same state as that prior to the memory elements being sensed (1204). Such an action can include conditioning operations as described herein or equivalents.

While embodiments can include architectures and methods for transferring time-to-change memory elements in a wide bit widths, and conditioning such memory elements, other embodiments can include circuits and methods for sensing data states for such time-to-change elements.

Sensing circuits and methods according to embodiments can include differential sensing. Differential sensing according to particular embodiments will now be described.

Figure 13A:
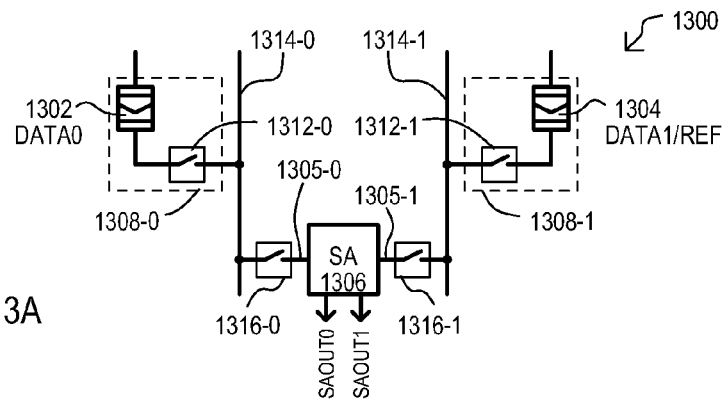
FIGS. 13A to 13D are diagrams showing sense operations for time-to-change memory elements according to an embodiment.
Figure 13B:
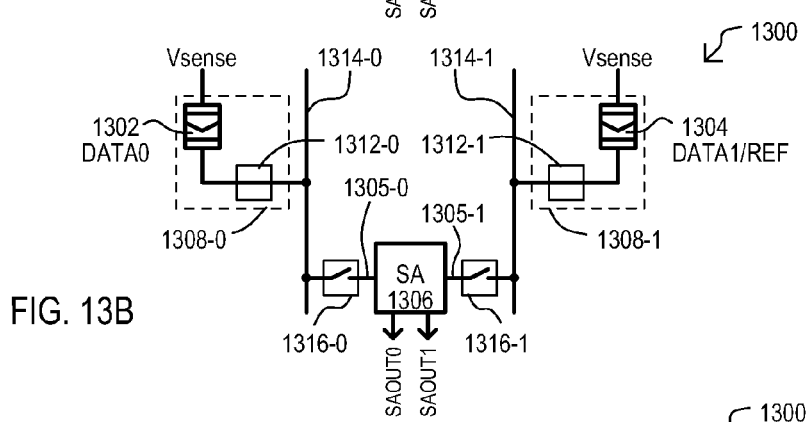
Figure 13C:
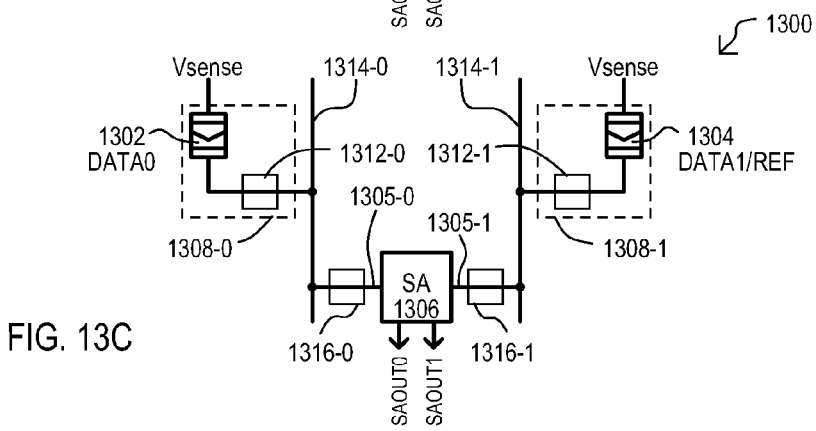

FIG. 13A to 13C show a differential sensing circuit 1300 according to an embodiment. A differential sensing circuit 1300 can compare a time-to-change in property of a first memory element 1302 to that of a second memory element 1304. More particularly, a first memory element 1302 can be capable of being written to first and second states having different times-to-change in property. The other memory element 1304 can be written to have a time-to-change response different from that of the first memory element 1302.

In some embodiments, a second memory element 1304 can be a reference memory element programmed to a time-to-change state between those of the first memory element 1302. Consequently, when sense conditions are applied to a first memory element 1302 and reference memory element 1304, if first memory element 1302 undergoes a change in property before the reference memory element 1304, it can be determined to store one data value. However, if a reference memory element 1304 undergoes change in property before the first memory element 1302, the first memory element 1302 can be determined to store another data value.

In other embodiments, a second memory element 1304 can be a complementary memory element programmed to a time-to-change state different from that of memory element 1302. That is, a data value is stored by states of both memory elements 1302/1304.

FIGS. 13A to 13C also show a first memory cell 1308-0, a second memory cell 1308-1, a first bit line 1314-0, a second bit line 1314-1, and a differential amplifier 1306. A first memory cell 1308-0 can include an access device 1312-0 that can selectively connect a first memory element 1302 to first bit line 1314-0. In a similar fashion, a second memory cell 1308-1 can include an access device 1312-1 that can selectively connect a second memory element 1304 to bit line 1314-1.

Differential amplifier 1306 can amplify a difference between two inputs (1305-0/1) to determine a sensed data value. Differential amplifier 1306 can have one input connected to first bit line 1314-0 by one sense switch 1316-0, and another input connected to a second bit line 1314-1 by another sense switch 1316-1. In particular embodiments, a differential amplifier 1306 can amplify a voltage difference (e.g., can be a voltage sense amplifier), while in other embodiments a differential amplifier 1306 can amplify a current difference (e.g., can be a current sense amplifier). In still other embodiments, a differential amplifier 1306 can utilize a combination of voltage and current sensing. Differential amplifier 1306 can provide a sensed data value on sense amplifier outputs SAOUT0/1. It is noted that while FIGS. 13A to 13C show a differential type output, in alternate embodiments, an output can be single ended (i.e., a single signal). Further, in alternate embodiments sense amplifier inputs 1305-0/1 can be same as sense amplifier outputs SAOUT0/1.

Figure 13D:
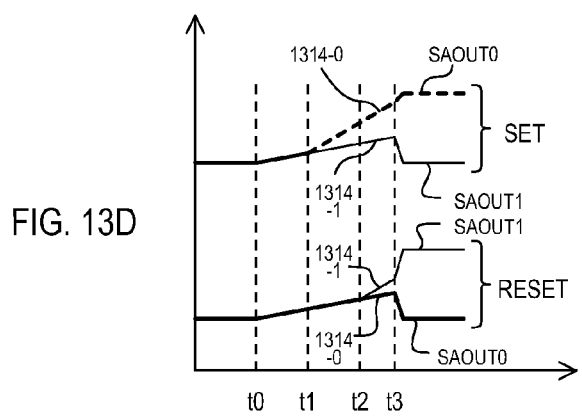

A sensing operation according to one embodiment will now be described with reference to FIGS. 13A to 13D. FIG. 13D is a timing diagram showing a response of a bit lines 1314-0/1 and sense amplifier outputs (SAOUT0/1) for two different cases. A SET case shows a response when a first memory element 1302 has an increase in conductivity before a second memory element 1304. A RESET case shows a response when a second memory element 1304 has an increase in conductivity before a first memory element 1302.

Referring to FIG. 13A in conjunction with FIG. 13D, prior to the start of a sense operation (i.e., prior to time t0), access devices 1312-0/1 can be open and sense switches 1316-0/1 can be open, isolating bit lines (1314-0/1) from differential amplifier 1306. Isolated bit lines (1314-0/1) can be precharged to a precharge voltage.

Referring to FIG. 13B in conjunction with FIG. 13D, in a first part of a sense operation (at about time t0), access devices 1312-0/1 can close (e.g., provide a low impedance), resulting in first memory element 1302 having one electrode connected to first bit line 1314-0, and second memory element 1304 having one electrode connected to second bit line 1314-1. Opposing electrodes of the memory elements (1302, 1304) can be driven to sense voltage (Vsense). In the particular embodiment shown, it is assumed Vsense is different than a bit line precharge voltage.

Referring to FIG. 13D, at about time t0, when memory elements (1302/1304) are connected to bit lines (1314-0/1), voltages on the bit lines 1314-0/1 can start to rise.

In the SET case, at about time t1, first memory element 1302 can dynamically change to a higher conductivity (before any such change occurs in the second memory element 1304), causing first bit line 1314-0 to rise in potential faster than second bit line 1314-1. This can create a differential voltage, with a voltage of first bit line 1314-0 being greater than second bit line 1314-1.

In contrast, in the RESET case, at about time t2, second memory element 1304 can dynamically change to a higher conductivity (before any such change occurs in first memory element 1302), causing second bit line 1314-1 to rise in potential faster than first bit line 1314-0. This can create a differential voltage opposite to that of the SET case, with a voltage of second bit line 1314-1 being greater than that of first bit line 1314-0.

Referring to FIG. 13C, in a second portion of a sense operation, sense switches 1316-0/1 can close (e.g., provide a low impedance), resulting in bit lines (1314-0/1) being connected to sense amplifier inputs (1305-0/1) of differential amplifier 1306. In some embodiments, once a differential voltage has been developed across sense amplifier inputs (1305-0/1), sense switches 1316-0/1 can open, isolating bit lines 1314-0/1 from the sense amplifier inputs 1305-0/1. Further, access devices 1314-0/1 can isolate their corresponding memory elements (1302/1304) from the bit lines 1314-0/1.

In the embodiment of FIG. 13D, a differential amplifier 1306 can amplify a voltage difference present on bit lines. Thus, at time t3, in the SET case, a sense amplifier output SAOUT0 can be driven to a high sense voltage, with sense amplifier SAOUT1 being driven to a low sense voltage. In contrast, in the RESET case, a sense amplifier output SAOUT0 can be driven to a low sense voltage, with sense amplifier SAOUT1 being driven to a high sense voltage.

Embodiments utilizing differential sensing as disclosed herein can take various forms. Particular memory device architectures utilizing such sensing are disclosed below.

Figure 14:
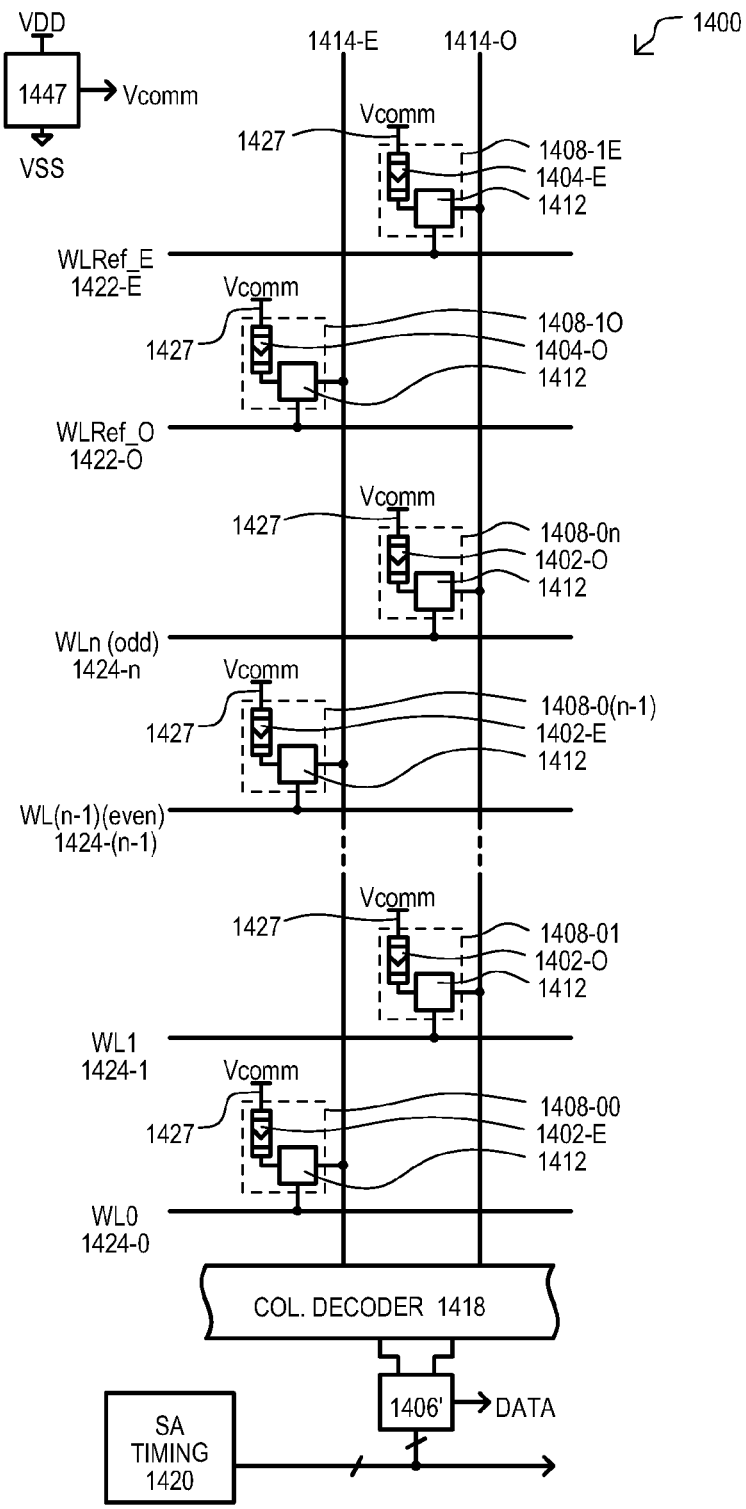
FIG. 14 is a block schematic diagram of a memory device with time-to-change elements and a folded bit line architecture, according to an embodiment.

FIG. 14 shows a "folded" bit line architecture 1400 according to an embodiment.

Architecture 1400 can include even and odd bit lines (1414-E/O) connected to a sense amplifier circuit 1406' by a column decoder 1418. Operations of a sense amplifier circuit 1406' can be controlled by a sense amplifier timing circuit 1420. A column decoder 1418 can selectively connect an even and odd bit line to sense amplifier circuit 1406' according to decoding values.

Odd reference cell 1408-1O and even data cells 1408-00 to -0(n-1) can be connected to even bit line 1414-E. Odd reference element 1404-O within odd reference cell 1408-1O can be connected to even bit line 1414-E by activation of an odd reference line WLRef_O. Memory elements 1402-E within even memory cells (1408-00, to -0(n-1)) can be connected to even bit line 1414-E by corresponding even word lines (1424-0, 2 ... n-1). Similarly, an even reference element 1408-1E within even reference cell 1408-1E can be connected to odd bit line 1414-O by activation of an even reference line WLRef_E. Odd memory elements (e.g., 1402-O) within odd memory cells (1408-1, 3 ... -n) can be connected to odd bit line 1414-O by corresponding odd word lines (1424-1, 3 ... -n).

In a sense operation, when an even word line (1424-0, 2 ... -n-1) is activated, an even reference line WLRef_E 1422-E can be activated. As a result, an even memory element 1402-E can be connected to even bit line 1414-E, while an even reference element 1404-E can be connected to odd bit line 1414-O. However, when an odd word line (1424-1, 3 ... -n) is activated, an odd reference line WLRef_O 1422-O can be activated. As a result, an odd reference element 1404-O can be connected to even bit line 1414-E, while an odd memory element 1402-O is connected to odd bit line 1414-O. Bit lines (1414-E/O) can be connected to sense amplifier circuit 1406 by column decoder 1418. A sense amplifier circuit 1406 can then determine a data value based on a difference in a time-to-change property between the selected memory element and the selected reference element.

In the embodiment shown, data and reference elements (1402-0 to -n, 1404-E/O) can have terminals commonly connected to a "plate" 1427. In some embodiments, a plate 1427 can be maintained at a constant potential during a sense operation. However, in other embodiments, such a plate can be driven to different voltages in a sense operation. In the embodiment shown, a plate driving circuit 1447 can provide a plate voltage (Vcomm) to the plate 1427.

Figure 15:
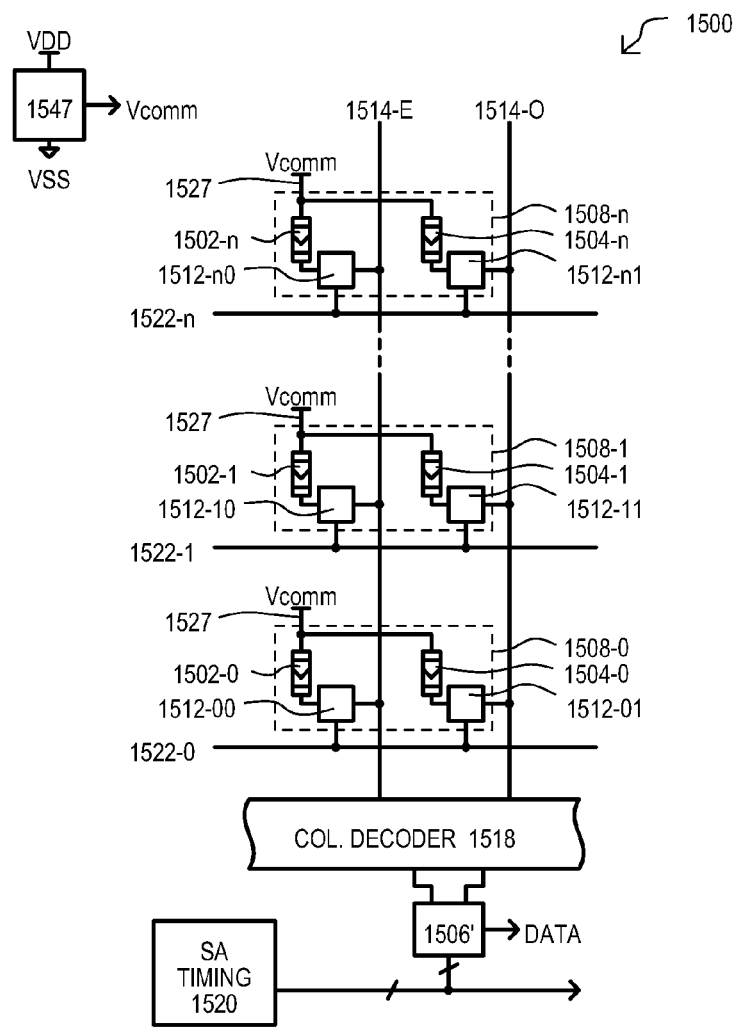
FIG. 15 is a block schematic diagram of a memory device with two time-to-change elements per memory cell, according to an embodiment.

FIG. 15 shows another folded bit line architecture 1500 according to an embodiment. Architecture 1500 may include features like those of FIG. 14.

FIG. 15 differs from FIG. 14 in that memory cells (1508-0 to -n) may each include two access devices (1512-x0/x1, where x is 0 to n) and two memory elements (1502-0 to -n, 1504-0 to -n). Access devices (1512-x0/x1) of a same memory cell may connect corresponding memory elements to bit lines (1514-E/O) in response to signals on a same word line (1522-0 to -n).

As in the case of FIG. 14, elements (1502-0 to -n, 1504-E/O) may have terminals commonly connected to a plate 1527 that can be maintained at a constant potential (Vcomm) during a sense operation. Alternatively, a plate 1527 can be driven to different voltages in a sense operation.

Figure 16:
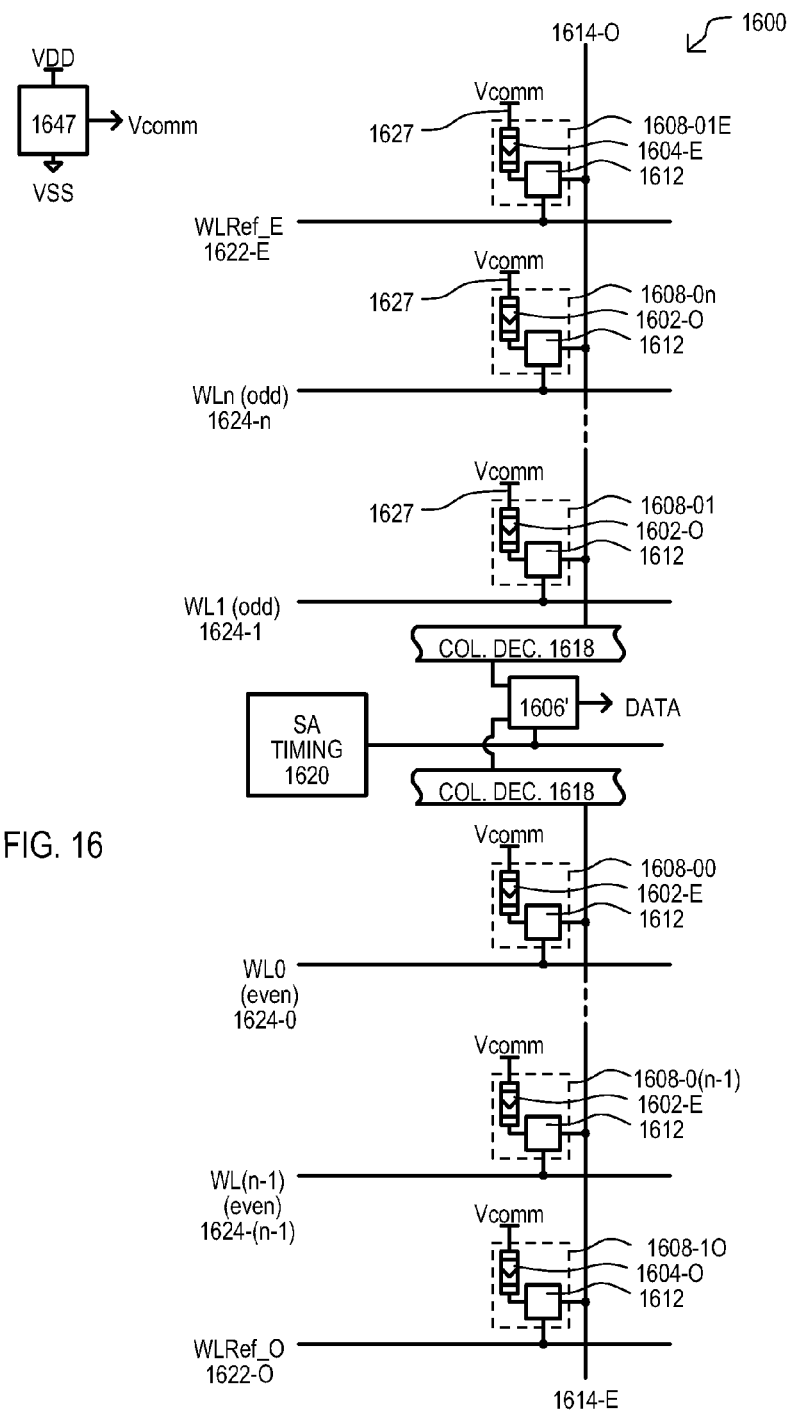
FIG. 16 is a block schematic diagram of a memory device with time-to-change elements according and an open bit line architecture, according to an embodiment.

FIG. 16 shows an open bit line architecture 1600 according to an embodiment. Architecture 1600 can include items like those of FIG. 14, and such like items are referred to by the same reference characters but with the first two characters being "16" instead of "14".

FIG. 16 differs from FIG. 14 in that even bit lines (e.g., 1614-E), even memory cells (e.g., 1608-00 to -0(n-1)), and odd reference cells (e.g., 1608-1O) can be formed on one physical side of a sense amplifier circuit 1606'. Odd bit lines (e.g., 1614-O), odd memory cells (e.g., 1608-01 to -0n), and even reference cells (e.g., 1608-1E) can be formed on a different physical side of a sense amplifier circuit 1606. As a result, unlike FIG. 14, even word lines (1624-0, 2 ... -n-1) do not intersect odd bit lines (e.g., 1614-O), and odd word lines (1624-1, 3 ... -n) do not intersect even bit lines (e.g., 1614-E).

In a sense operation in which an even word line (1624-0, 2 ... -n-1) on a first side of sense amplifier circuit 1606' is activated, an odd reference line WLRef_O 1622-O on an opposing, second side of sense amplifier circuit 1606' can be activated. Conversely, when an odd word line (1624-1, 3 ... -n) on the second side of sense amplifier circuit 1606' is activated, an even reference line WLRef_E 1622-E on an opposing side of sense amplifier circuit 1606' can be activated.

Memory cells on opposing sides of sense amplifier circuit 1606' can be conceptualized as being different arrays or portions of an array. In the embodiment shown, data and reference elements (1602-0 to -n, 1604-E/O) can have terminals commonly connected to a "plate" 1627 having a voltage (Vcomm). Such a plate can be maintained at a constant voltage, or alternatively, actively driven in a sense operation (i.e., Vcomm can be constant, or can vary according to operation).

It is understood that in another embodiment, an open bit line architecture can have memory cells like those of FIG. 13A (i.e., a two element cell). In such an embodiment, different portions of a same memory cell can be disposed on opposing sides of a sense amplifier circuit. For example, cells 1608-01 and 1608-00 can form a same memory cell, and would be selected together by the activation of word lines WL1 and WL0, with column decoder 1618 providing a path to sense amplifier circuit 1606'.

Figure 17:
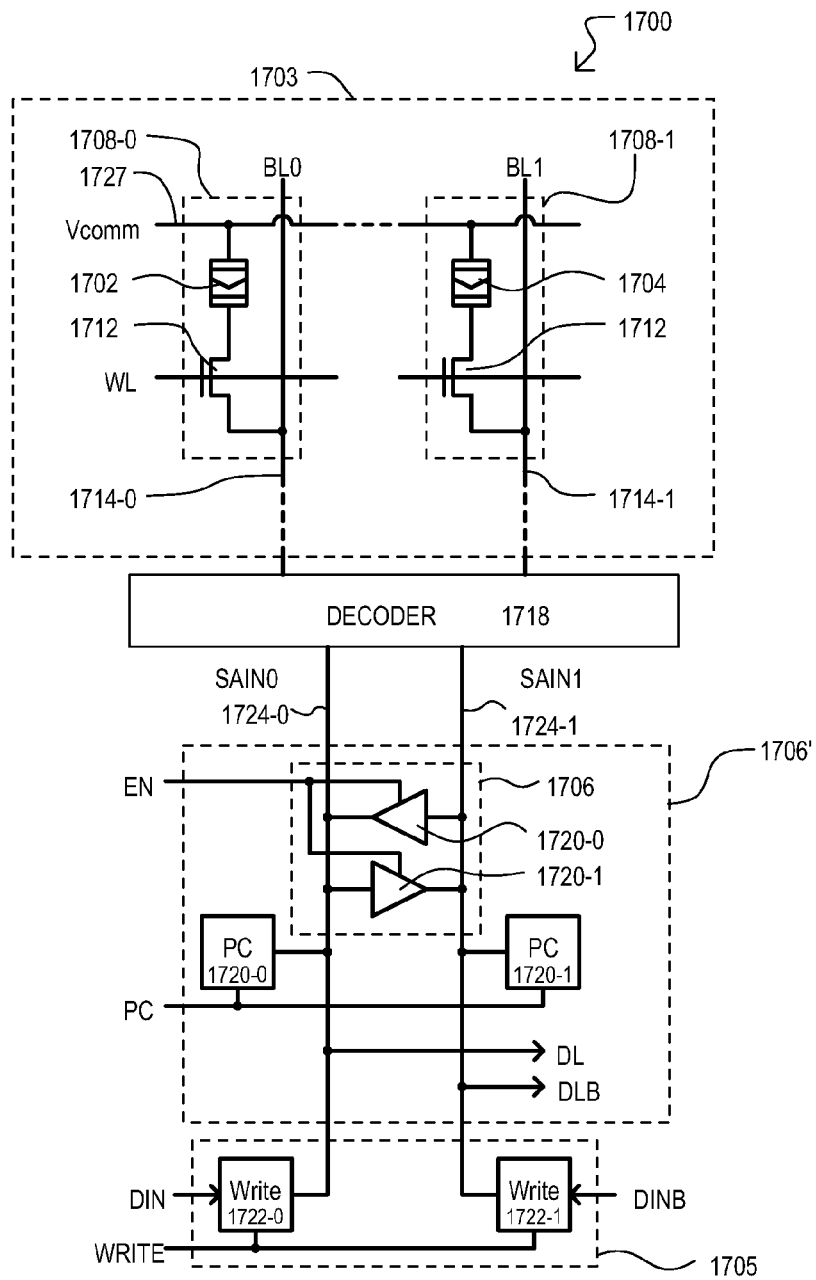
FIG. 17 is a block schematic diagram of a memory device with time-to-change elements and pre-charge circuits according to an embodiment.

FIG. 17 shows a memory device 1700 according to another embodiment in block schematic diagram. A memory device 1700 can include an array 1703, a decoder 1718, a sense amplifier (SA) circuit 1706', and a write circuit 1705.

An array 1703 can include first memory elements (one shown as 1702) and second memory elements (one shown as 1704) as described herein, or equivalents. Such an array 1703 can include bit lines (two shown as 1714-0/1), some of which can be connected to a first cell (one shown as 1708-0). One or more other bit lines can be connected to a second cell (one shown as 1708-1).

As understood from the embodiments above, a memory device 1700 can have a configuration in which a memory cell includes one element (and is compared to a reference element), or can include two memory elements (that are compared to one another).

Accordingly, in one embodiment, each memory cell (e.g., 1708-0) can include a data element 1702 and an access device 1712. More particularly, a data element 1708-0 can be a two terminal device having one terminal connected to a common node 1727 and another terminal connected to the corresponding access device 1712. A data element 1702 can be written into two or more different states, each state having a different time-to-change in property. Access devices 1712 can be transistors, more particularly, insulated gate (e.g., metal-oxide-semiconductor, MOS) field effect transistors FETs, even more particularly, n-channel MOSFETs.

A decoder 1718 can selectively connect bit line pairs (i.e., one connected to a first element and one connected to a second element) to sense amplifier inputs 1724-0/1 (SAIN0/1).

A sense amplifier circuit 1706' can include amplifier 1706 and precharge circuits 1720-0/1. An amplifier 1706 can include driver circuits 1720-0/1 cross-coupled between sense amplifier inputs 1724-0/1. An amplifier 1706 formed with driver circuits (1720-0/1) can be an advantageously compact circuit. In response to an active enable signal EN, amplifier 1706 can drive sense amplifier inputs 1720-0/1 between opposing sense voltage levels (e.g., a logic high and logic low level) based on sensed impedances of elements (e.g., 1702/1704).

Precharge circuits 1720-0/1 can drive sense amplifier inputs (and hence a selected bit line pair through decoder 1718) to a precharge voltage in response to an active precharge signal PC. In addition or alternatively, precharge circuits 1720-0/1 can be connected to bit lines (e.g., 1714-0/1), and can precharge bit lines directly (i.e., not via decoder 1718).

Write circuits 1722-0/1 can drive sense amplifier inputs (and hence a selected bit line pair through decoder 1718) to voltage levels based on write data values DIN/DINB. In some embodiments, write circuits (1722-0/1) can perform a conditioning operation, as described above.

In another embodiment, each memory cell can include both cells 1708-0/1, which can be accessed together. A first element 1702 of such a memory cell (1708-0/1) can be written into two or more different states, each state having a different time-to-change in property. A second element 1704 of the memory cell (1708-0/1) can be written to a state different than that of first element 1702.

Figure 18:
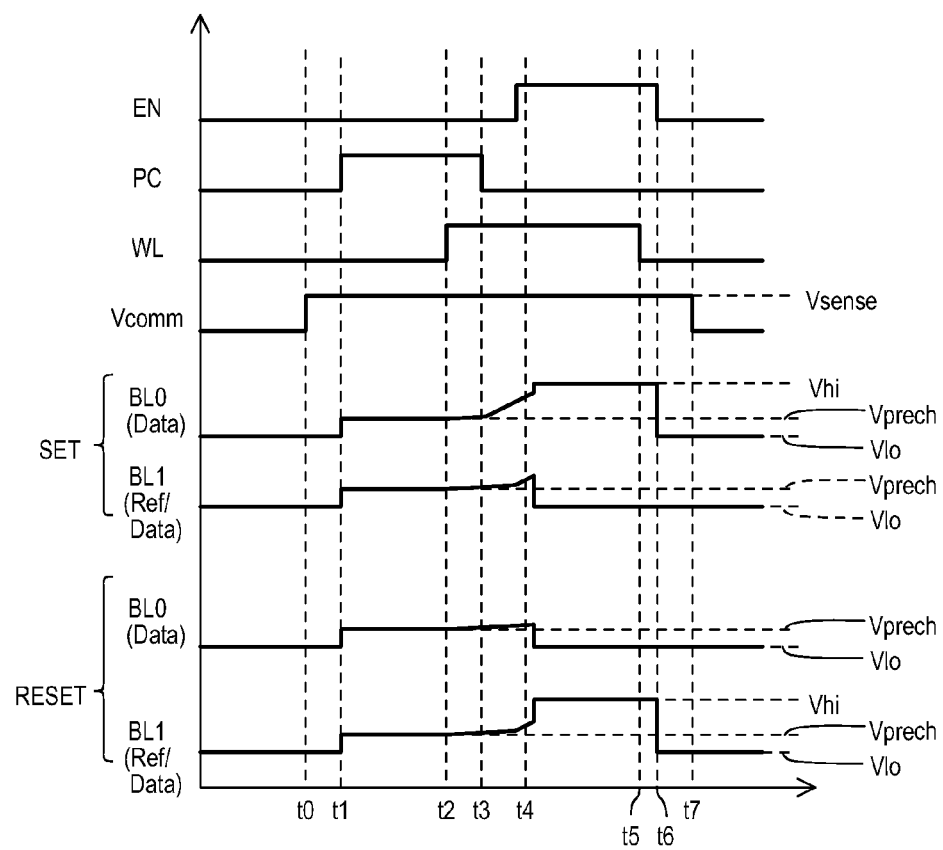
FIG. 18 is a timing diagram showing a read operation for a memory device like that of FIG. 17 according to one embodiment.

FIG. 18 is a timing diagram showing a read operation for the memory device of FIG. 17 according to one embodiment. FIG. 18 shows various waveforms, including: EN which is an activation signal for amplifier 1706; PC which is an activation signal for precharge circuits 1720-0/1; WL which represents select signals (e.g., word line signals) that result in a memory/reference element pair (e.g., 1702/1704) being connected to a corresponding bit line pair (BL0/1) (e.g., 1714-0/1); and Vcomm which shows a common sense bias voltage applied to a common node 1727.

FIG. 18 also shows two responses of a bit line pair BL0/1 (1714-0/1), one for a SET state, the other for a RESET state. In the embodiment shown, the SET and RESET states represent different times to change in conductivity. More particularly, in a SET state, one element 1702 has a shorter time-to-change than a reference element (or its oppositely programmed complementary element) 1704. In the RESET state, the one element 1702 has a longer time-to-change than a reference element (or its oppositely programmed complementary element) 1704.

At about time t0, Vcomm can transition high, driving one electrode of elements 1702 and 1704 to a sense voltage Vsense via a common node 1727.

At about time t1, PC can be activated (transition high in this case), causing precharge circuits 1720-0/1 to drive sense input nodes 1724-0/1 to a precharge voltage Vprech. It is assumed that decoder 1718 provides a low impedance path between bit lines 1714-0/1 and sense input node 1724-0/1, thus the bit lines (BL0/1) may also be driven to Vprech. In this embodiment, Vprech is less than Vsense.

At about time t2, WL can be activated (transition high in this case). As a result, cell 1708-0 can connect element 1702 to bit line BL0 1714-0, and memory cell 1708-1 can connect element 1704 to bit line BL1 1714-1. Such actions may create a bias voltage (Vsense−Vprech) across the elements (1702 and 1704). Such elements may initially have very low, or substantially no conductivity.

At about time t3, PC can return to the inactive state allowing a potential of bit lines to vary according to the conductivity of their corresponding element.

Between time t3 and t4, in the SET case, an element 1702 may change to a higher, or more conductive state, while the other element 1704 may maintain a low, or substantially non-conductive state. Consequently, bit line 1714-0 may rise toward Vsense faster than bit line 1714-1. In the RESET case, an element 1702 may maintain a low, or substantially non-conductive state, while the other element 1704 may change to a higher, or more conductive state. Consequently, unlike the SET case, in the RESET case, bit line 1714-1 may rise toward Vsense faster than bit line 1714-0.

At about time t4, EN may be activated (transition high in this case), activating amplifier circuit 1706. In response, any differential voltage between bit lines 1714-0/1 may be latched, driving one bit line to a high level Vhi and the other to a low level Vlo. In the SET case, data bit line BL0 1714-0 may be driven to Vhi, while bit line BL1 1714-1 may be driven to Vlo. The RESET case can result in the opposite response, with bit line BL0 1714-0 being driven to Vlo, while bit line BL1 1714-1 may be driven to Vhi.

At about time t5, WL can return to an inactive level. As a result, elements 1702 and 1704 can be isolated from bit lines BL0/1 1714-0/1.

At about time t6, EN can return to an inactive state. As a result, any differential voltage between bit lines 1714-0/1 may no longer be amplified. Further, in the embodiment shown, both bit lines 1714-0/1 may be reset to a Vlo voltage.

At about time t7, Vcomm can return to a low level deselecting memory cells from a sense operation.

Figure 19A:
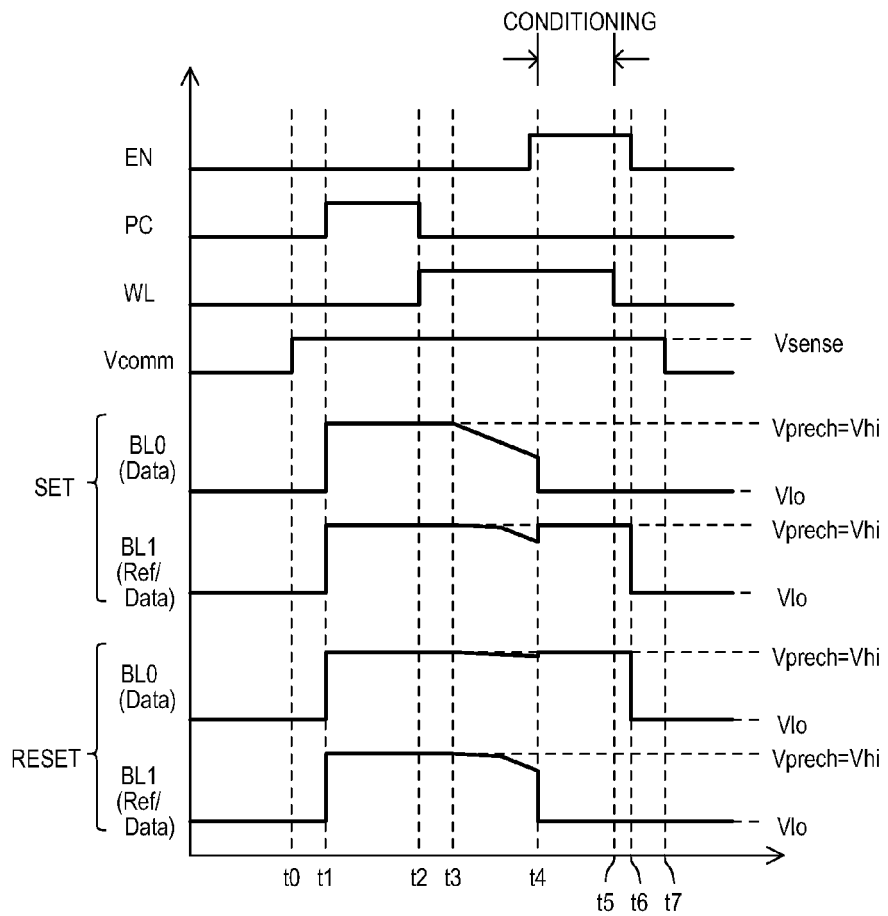
FIGS. 19A to 19C are diagrams showing a read operation for a memory device like that of FIG. 17 according to another embodiment.

FIG. 19A is a timing diagram showing an alternative read operation for the memory device of FIG. 17, according to one embodiment. FIG. 19A shows a read operation that can have an automatic conditioning operation that follows a sensing operation.

FIG. 19A shows some the same waveforms as FIG. 18, but can differ from FIG. 18 as noted below.

Unlike FIG. 18, FIG. 19A shows responses of bit lines (BL0/1). Further, in FIG. 19A a precharge voltage Vprech can be higher than the sense voltage of Vcomm (i.e., Vprech>Vsense). In a very particular embodiment, a precharge voltage Vprech can be the same as a high voltage (Vhi) driven by amplifier 1706.

Thus, at about time t1, when PC is activated, precharge circuits 1720-0/1 can drive sense input nodes 1724-0/1 and bit lines (BL0/1) 1714-0/1 to Vprech=Vhi.

Between time t3 and t4, in the SET case, bit line 1714-0 can fall from Vprech to Vsense faster than bit line 1714-1. In the RESET case, bit line 1714-1 can fall toward Vsense faster than bit line 1714-0.

At about time t4, by activation of amplifier 1706 according to signal EN, in the SET case, bit line BL0 1714-0 can be driven to Vlo, while the bit line BL1 1714-1 can be driven to Vhi. In contrast, in the RESET case, bit line BL1 1714-1 can be driven to Vlo, while the bit line BL0 1714-0 can be driven to Vhi.

It is noted that such actions place a voltage across the data element 1702 opposite to that in the sense operation between times t3 and t4. Such an action can serve as a conditioning operation for the element.

Figure 19B:
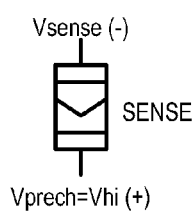
Figure 19C:
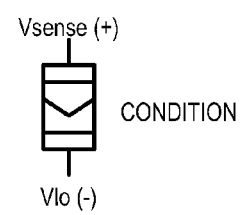

In more detail, as shown in FIG. 19B, in a sense action, a voltage across a SET data element can be Vsense−Vhi, which is negative, as Vhi>Vsense. However, once the amplifier drives bit lines, as shown in FIG. 19C, a voltage across the SET data element can be Vsense−Vlo, which is positive, as Vsense>Vlo. Such conditioning can enable memory elements to recover stored data values in response to various drift inducing events that can undesirable alter a stored time-to-change state. Such drift inducing events can include, without limitation, a read operation itself (i.e., read bias applied to elements) or cycling (i.e., repeated read and/or write operations, or soak time).

Referring back to FIG. 19A, at about time t5, WL can return to an inactive state, isolating the memory elements from the bit lines.

At about time t6, signal EN can return low, resulting in bit lines returning to the Vlo level.

At about time t7, Vcomm can return to a low level, deselecting memory cells from a sense operation.

Figure 19D:
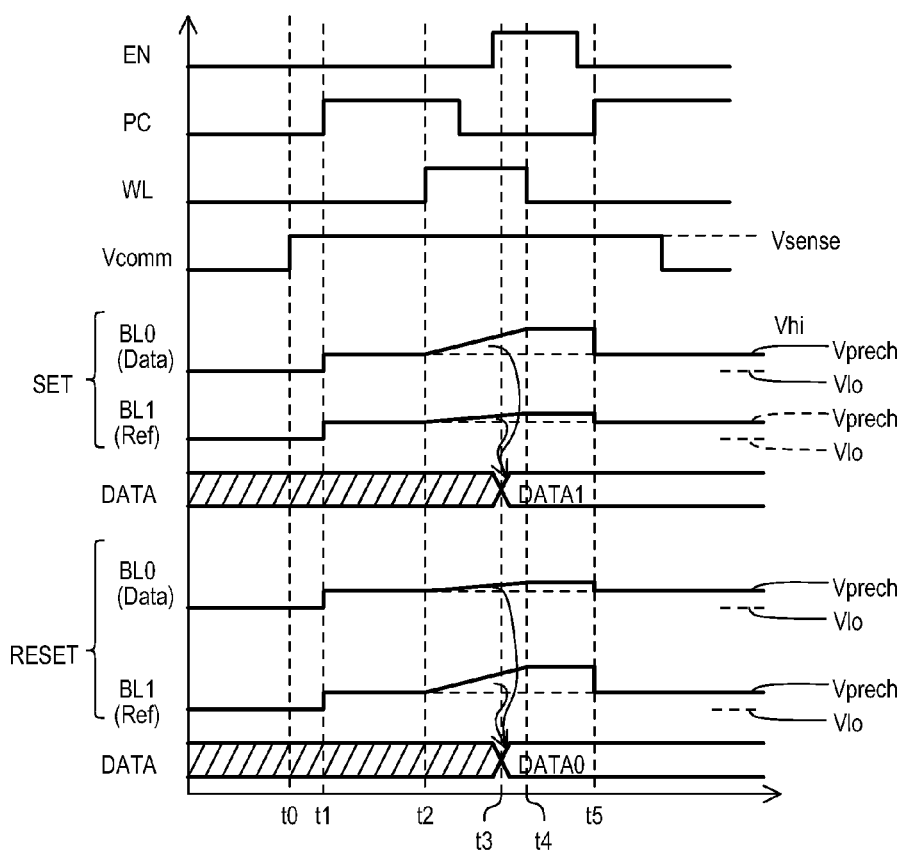
FIG. 19D is a timing diagram showing a read operation for a memory device like that of FIG. 17 according to a further embodiment.

FIG. 19D is a timing diagram showing a further read operation for a memory device like that of FIG. 17, according to an embodiment. FIG. 19D differs from those of FIGS. 18 and 19A in that a sense amplifier does not drive bit lines in response to a sensed data value. Accordingly, FIG. 19D includes a waveform DATA reflecting an output of a sense amplifier. In the embodiment shown, such a data value (DATA) is based on a sensed difference between the bit lines BL0/1.

FIG. 19D shows the same waveforms as FIG. 18, but can differ from FIG. 18 as noted below.

Unlike FIG. 18, at about time t3, data values are sensed, causing DATA to output a value corresponding to the memory element(s) state. Further, at such a time bit lines are not driven to any particular level, but can continue to rise.

At about time t4 word line WL can return low, isolating memory elements from bit lines. Consequently, bit lines can no longer change based on element states.

At about time t5, PC is activated once again, driving bit lines 1714-0/1 back to the precharge level.

Figure 20A:
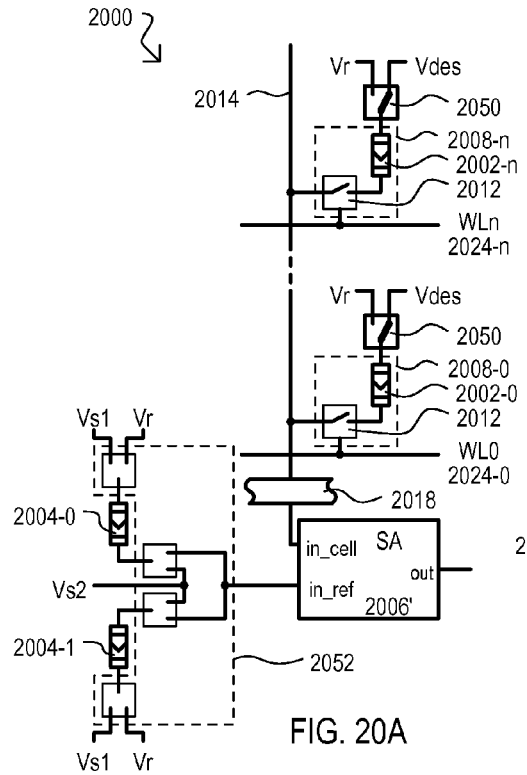
FIGS. 20A to 20C are a sequence of block schematic diagrams of a memory device with time-to-change elements in which one reference element is conditioned while another is utilized in a sense operation, according to embodiments.
Figure 20B:
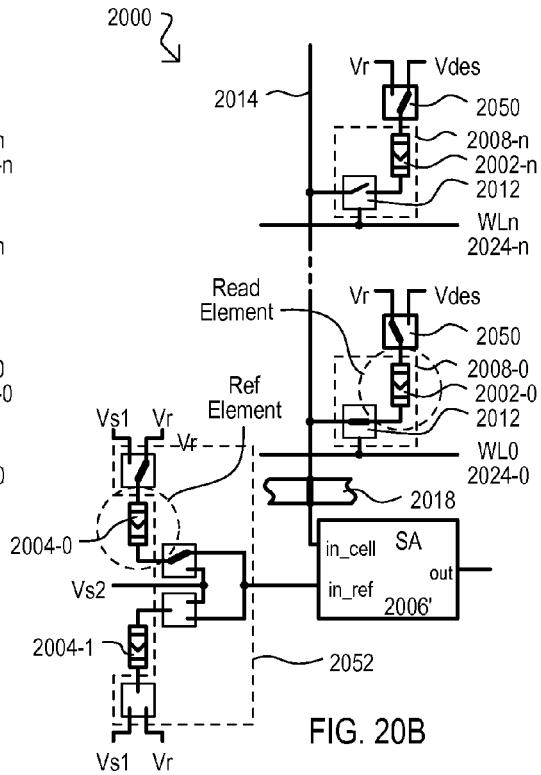
Figure 20C:
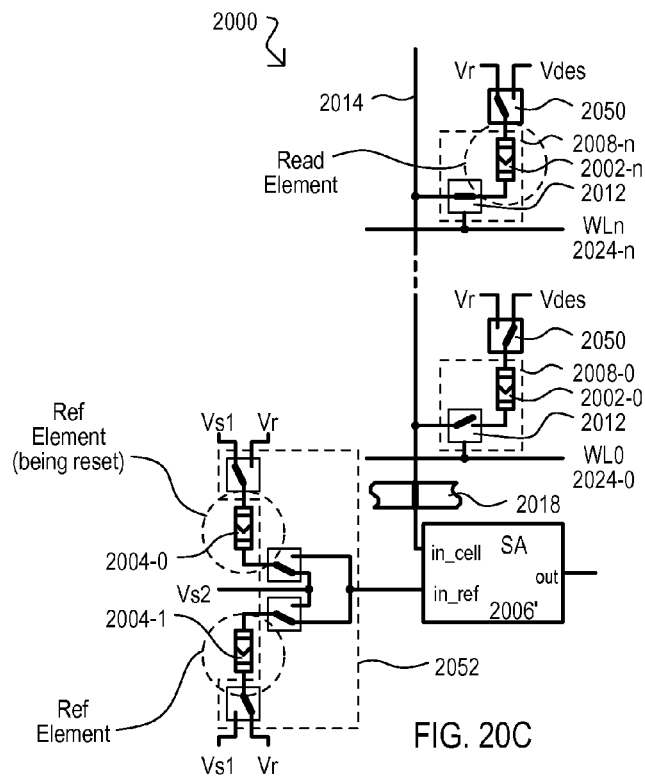

FIGS. 20A to 20C show a memory device 2000 and related operations according to further embodiments in a sequence of block schematic diagram. A memory device 2000 can include multiple reference elements so that one reference element can be conditioned while another is used in a sense operation.

A memory device 2000 can include data memory cells (some shown as 2008-0 to -n) connected to data bit lines (one shown as 2014). Each memory cell (e.g., 2008-0 to -n) can include an access device 2012 and a data element (2002-0 to -n). Data elements (2002-0 to -n) can be written to two or more different states, each state having a different time-to-change in property, as described herein or equivalents.

A decoder 2018 can connect one of many data bit lines (e.g., 2014) to one input (in_cell) of a sense amplifier circuit 2006' in response to address values.

A reference switching circuit 2052 can connect one of multiple reference elements (e.g., 2004-0/1) to another input (in_ref) of sense amplifier circuit 2006'. It is understood that in some embodiments, a reference switching circuit 2052 can include a bit line and an access device, as shown in other embodiments herein (e.g., could be a folded or open bit line architecture).

FIGS. 20A to 20C show a sensing and reference element conditioning operation according to an embodiment.

FIG. 20A shows a memory device 2000 prior to a sense operation. Data elements (2002-0 to -n) and reference elements 2004-0/1 are isolated from inputs of a sense amplifier circuit 2006'. Further, in the arrangement shown, data elements (2002-0 to -n) can have one electrode connected to a deselect voltage (Vdes).

FIG. 20B shows a read operation that senses a state of a data element 2002-0 by comparing its dynamic response to that of reference element 2004-0. Data element 2002-0 can have one terminal connected to a read voltage Vr. An opposing terminal is connected bit line 2014 by the corresponding select device 2012 being enabled by word line WL0 2024-0. Bit line 2014 can be connected to input in_cell of sense amplifier circuit 2006' by a decoder 2018. Reference switching circuit 2052 connects one terminal of reference element 2004-0 to read voltage Vr, and an opposing terminal to input in_ref of sense amplifier circuit 2006'.

Referring still to FIG. 20B, sense amplifier circuit 2006' can determine a data value stored by data element 2002-0 according to a differences in a time-to-change in property between data element 2002-0 and reference element 2004-0. In such a reading operation, other data elements (e.g., 2002-n) and reference element 2004-1 can remain isolated from sense amplifier circuit 2006'.

FIG. 20C shows a subsequent read operation that senses a state of a data element 2002-n by comparing its dynamic response to that of a second reference element 2004-1. While such a sense operation is taking place, previously used reference element 2004-0 can be subject to a conditioning operation to ensure such a reference element returns to a state suitable for detecting data values (i.e., a state having a different time-to-change in property than data elements). Data element 2002-n can have terminals connected between read voltage Vr and input in_cell of sense amplifier circuit 2006'. Reference switching circuit 2052 can connect reference element 2004-1 between read voltage Vr and input in_ref of sense amplifier circuit 2006'. Sense amplifier circuit 2006' can determine a data value stored by data element 2002-n by comparing its time-to-change in property to that of reference element 2004-1.

Also at this time, reference switching circuit 2052 can connect terminals of previously utilized reference element 2004-0 between conditioning voltages Vs1 and Vs2. Such an arrangement can return reference element 2004-0 to its state prior the sensing operation of data element 2002-0.

While embodiments can include sensing circuits that compare one memory element time-to-change response to that of another memory element, other embodiments can utilize a reference signal to sense a data value. Embodiments with reference signals will now be described.

Figure 21A:
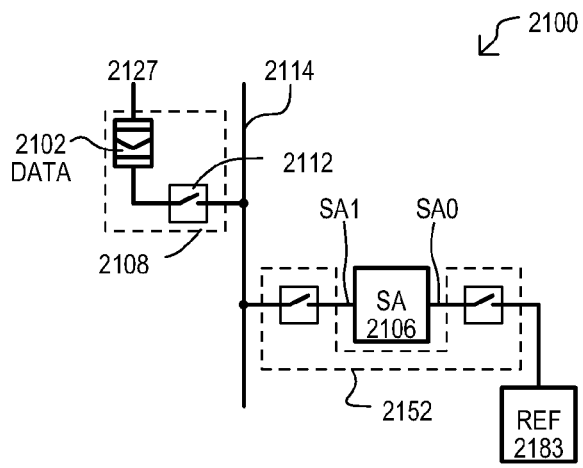
FIGS. 21A and 21B are diagrams showing a memory device with time-to-change elements and a reference signal generator circuit, according to an embodiment.

FIG. 21A shows a memory device 2100 according to an embodiment. A memory device 2100 can include a memory cell 2108, reference switching circuit 2152, sense amplifier circuit 2106, and a reference signal source 2183.

In a sense operation, an access device 2112 within memory cell 2108 can connect a memory element 2102 to a bit line 2114. Further, reference switching circuit 2152 can connect bit line 2114 to one input of sense amplifier 2106, and can connect reference signal source 2183 to another input of sense amplifier 2106. After a predetermined time period, a data element 2102 may or may not undergo a change in property, changing a voltage and/or current on bit line 2114. Such a change can be compared with a reference signal from reference signal source 2183 to determine a data value stored by memory element 2102.

Figure 21B:
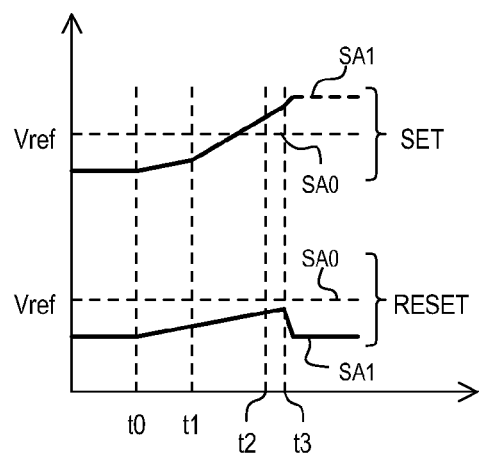

FIG. 21B shows a sense operation according to one very particular embodiment. FIG. 21B shows waveform: SA1 which shows a first input of sense amplifier circuit 2106 (which can also an first output); SA0 which shows a second input of sense amplifier circuit 2106, which can receive a reference signal.

At about time t0, a memory element 2102 can be connected to a bit line via access device 2108. It is understood that node 2127 can be biased to a bias voltage at this time. Initially, regardless of element state (SET/RESET), memory element 2102 can have a relatively low conductance, thus input SA1 can have a relatively small change in voltage. At the same time, a second sense amplifier input SA0 can be driven to a reference voltage Vref.

At about time t1, in the SET case, a memory element 2102 can undergo a change to a higher conductance. Consequently, SA1 can rise in potential toward the voltage of node 2127 (which is understood to be higher than Vref). In contrast, in the RESET case, a memory element 2102 does not undergo a change to a higher conductance. Consequently, SA1 can continue a relatively slow rise in potential.

Between times t2 and t3, in the SET case, a sense amplifier input SA1 can rise above Vref. In contrast, in the RESET case, sense amplifier input SA1 remains below Vref.

In the particular embodiment of FIG. 21B, at about time t3, sense amplifier circuit 2106 can be activated, amplifying the difference between SA1 and SA0. Accordingly, in the SET case, SA1 can be driven to a high voltage, while in the RESET case, SA1 can be driven to a low voltage.

It is noted that while FIG. 21B shows a reference signal (Vref) that remains static, in alternate embodiments, such a reference signal can be dynamic changing over time in a way that differentiates it from both the SET and RESET responses.

While embodiments above have shown memory devices and corresponding methods, other embodiments will now be described with reference to flow diagrams.

Figure 22:
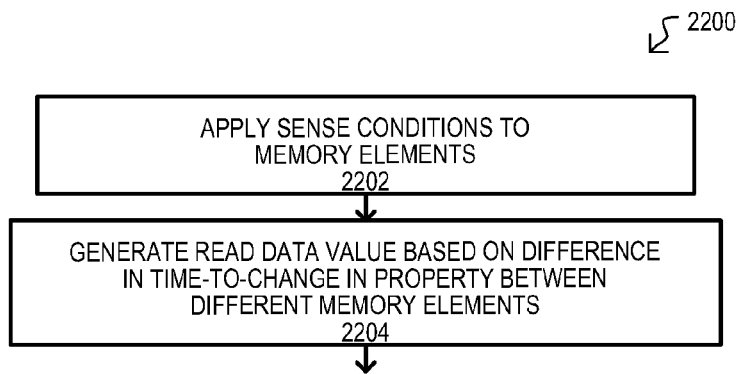
FIG. 22 is a flow diagram of a method according to a further embodiment.

FIG. 22 shows a method 2200 according to one embodiment in a flow diagram. A method 2200 can include applying sense conditions to memory elements (2202). Such an action can include applying conditions that will induce a change property in such memory elements. It is understood that one memory element can be written to have one or more different times-to-change than that of the other memory element. A read data value can then be generated based on a difference in a time-to-change in property between the memory elements (2204).

Figure 23:
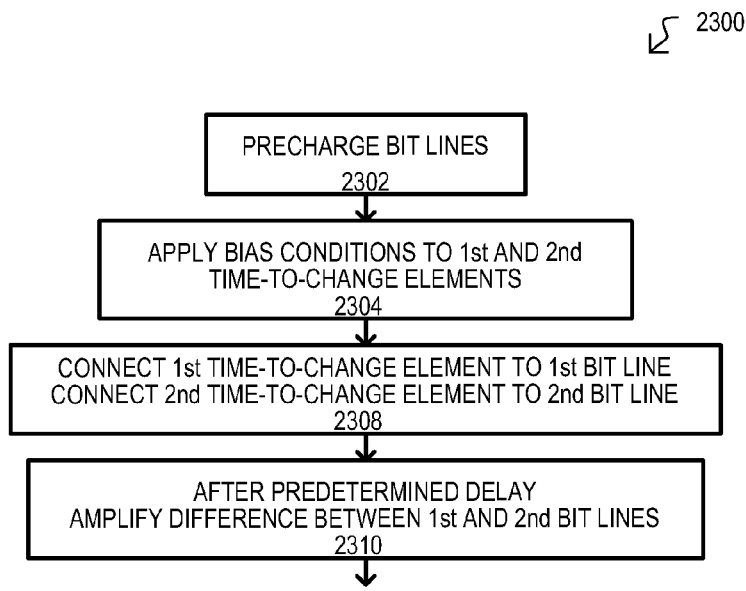
FIG. 23 is a flow diagram of method according to another embodiment.

FIG. 23 shows a method 2300 according to another embodiment. A method 2300 can include precharging bit lines (2302). Such an action can include driving bit lines to a same predetermined potential. Bias conditions can then be applied to first and second time-to-change elements (2304). Such an action can include applying bias voltages different than a precharge voltage.

A method can then connect a first element to a first bit line and a second element to a second bit line (2308). Such an action can create sense conditions across first and second elements that can induce a change in property in one element according to a stored data value, while the other element does not undergo a change in property, or undergoes a change in property at a different time than the other element.

After a predetermined delay, a difference between the first and second bit lines can be amplified (2310). It is understood that a difference between first and second bit lines can be a current difference between two bit lines, or can be a difference across sense amplifier inputs created by a difference between bit lines (e.g., a bit line differential sampled by a sense amplifier). Also, a predetermined delay can be longer than a time required to induce a change in one element if the element is programmed to one state (e.g., is in a SET state), but shorter than a time required to induce a change in the element if the element is programmed to another state (e.g., is RESET).

It should be appreciated that reference throughout this description to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory device, comprising:
   at least one array comprising a plurality of elements programmable between at least two different states, each state having a different time to a change in property under applied sense conditions;
   a read circuit configured to apply the sense conditions to selected elements and detect changes in property in the selected elements to generate read data;
   a latch circuit configured to store read data from the read circuit; and
   a transfer path configured to provide a parallel data transfer path between the read circuit and the latch circuit.

2. The memory device of 1, further including:
   the read circuit is configured to access at least N bits of data in parallel;
   the transfer path is configured to transfer N bits of data in parallel between the read circuit and the latch circuit; and
   an input/output (I/O) circuit configured to transfer data between the latch circuit and a data I/O path in groups of P bits, where P<N.

3. The memory device of claim 1, further including:
   a first decoding circuit coupled to the array and configured to connect a group of elements to the read circuit in response to at least a first portion of an address value; and
   a second decoding circuit configured to couple a portion of the data storage locations in the latch circuit to an external data path in response to at least a second portion of the address value.

4. The memory device of claim 1, further including:
   a serial input/output (I/O) circuit configured to selectively transfer data between the latch circuit and a serial connection in at least one serial data stream.

5. The memory device of claim 1, wherein:
   each element comprises at least one ion conducting layer formed between two electrodes.

6. The memory device of claim 1, wherein:
   the transfer path transfers no less than 128 bits in parallel between the read circuit and the latch circuit.

7. The memory device of claim 1, wherein:
   the plurality of elements includes first elements;
   the read circuit includes
      at least one sense amplifier configured to compare electrical signals received at two inputs to generate a sense data value;
      at least one reference circuit configured to generate a reference signal different from those generated by the first elements; and
      a reference switching circuit configured to couple one first element to one input of the sense amplifier and couple the reference circuit to another input of the sense amplifier.

8. The memory device of claim 1, wherein:
   the at least two different states of the memory elements include
      a first state in which an element undergoes a change in property within a time t1, and
      a second state in which an element does not undergo the change in property within the time t1.

9. The memory device of claim 7, wherein:
   the reference circuit comprises at least one reference element programmable to a reference state in which the reference element undergoes a change in property different from that of the first elements under the sense conditions.

10. The memory device of claim 9, further including:
    the reference circuit further includes a second reference element programmable to the reference state; and
    a conditioning circuit that selectively applies conditioning electrical signals to the second reference element, while the first reference element is connected to the at least one sense amplifier, the conditioning electrical signals substantially reversing property changes caused by applying sense conditions to the second reference element.

11. The memory device of claim 9, further including:
    a plurality of second memory elements programmable between at least the two different states;
    the reference circuit further includes a second reference element programmable to the reference state; and
    the reference switching circuit is further configured to couple one second memory element to one input of the sense amplifier and couple the second reference circuit to another input of the sense amplifier.

12. The memory device of claim 9, further including:
the at least one array includes a first bit line and a second bit line;
each first element is coupled to the first bit line by a first access device, each first access device being selectively enabled by a select signal on a corresponding first word line; and
the reference switching circuit includes at least a first reference element coupled to the second bit line by a reference access device enabled by a first reference enable signal; wherein
the first reference element is programmable to a reference state in which the reference element undergoes a change in property different from that of the first elements under the sense conditions.

13. The memory device of claim 12, further including:
the plurality of elements includes second elements, each second element being coupled to the second bit line by a second access device, each access device being selectively enabled by a select signal on a corresponding first word line; and
the second bit line has a location selected from the group of: a same physical side of the sense amplifier as the first bit line, and a physical side of the sense amplifier opposite to that of the first bit line.

14. The memory device of claim 7, wherein:
at least one sense amplifier comprises a latch formed by drivers cross coupled between first and second latching nodes; and
the reference switching circuit includes a data switch path configured to couple first elements to the first latching node and a reference switch path configured to couple the reference circuit to the second latching node.

15. The memory device of claim 7, further including:
precharge circuits, coupled to first and second bit lines, and configured to precharge the first and second bit lines to a precharge voltage prior to the sense amplifier generating the sense data value.

16. The memory device of claim 1, wherein:
each first element includes a memory material formed between a first electrode a second electrode, each first electrode being coupled to a first bit line, each second electrode being coupled to a conductive plate structure; and
a plate driving circuit that drives the plate structure to a read drive voltage in a read operation.

17. The memory device of claim 16, further including:
precharge circuits, coupled to at least the first bit lines and configured to precharge the first bit lines to a precharge voltage in response to a precharge signal; wherein
the precharge voltage has a first magnitude with respect to a reference voltage, and
the read drive voltage has a second magnitude with respect to the reference voltage.

18. The memory device of claim 7, wherein:
the memory elements are programmable between
a first state that provides a first change in property response to the sense conditions, and
a second state having a second change in property response under the sense conditions that is different from the first change in property response; and
the reference circuit provides a reference change in property response different from the first and second change in property responses.

* * * * *